(12) United States Patent
Sugi et al.

(10) Patent No.: US 7,898,024 B2
(45) Date of Patent: Mar. 1, 2011

(54) SEMICONDUCTOR DEVICE AND METHOD FOR MANUFACTURING THE SAME

(75) Inventors: Akio Sugi, Matsumoto (JP); Tatsuji Nagaoka, Matsumoto (JP); Hong-fei Lu, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 270 days.

(21) Appl. No.: 12/023,637

(22) Filed: Jan. 31, 2008

(65) Prior Publication Data

US 2008/0258211 A1 Oct. 23, 2008

(30) Foreign Application Priority Data

Jan. 31, 2007 (JP) ............... 2007-021828

(51) Int. Cl.
H01L 29/76 (2006.01)
H01L 29/78 (2006.01)
(52) U.S. Cl. .................. 257/330; 257/328; 257/329; 257/341; 257/396; 257/E29.185
(58) Field of Classification Search .......... 257/396, 257/333–335
See application file for complete search history.

(56) References Cited

U.S. PATENT DOCUMENTS

| 5,981,996 | A | 11/1999 | Fujishima |
| 6,635,544 | B2 | 10/2003 | Disney |
| 6,710,403 | B2 * | 3/2004 | Sapp ..................... 257/330 |
| 7,226,841 | B2 * | 6/2007 | Izumisawa et al. ......... 438/272 |
| 7,473,603 | B2 * | 1/2009 | Kraft et al. ............... 438/259 |
| 2004/0166636 | A1 | 8/2004 | Darwish |
| 2005/0253190 | A1 | 11/2005 | Okumura et al. |

FOREIGN PATENT DOCUMENTS

| JP | 2003-204064 A | 7/2003 |
| JP | 2005-302925 A | 10/2005 |
| WO | 2004-102670 A2 | 11/2004 |

OTHER PUBLICATIONS

Bhatnagar et al.; "Analysis of Silicon Carbide Power Device Performance"; IEEE, 1991 CH2987-6/91/0000-0176; Raleigh NC USA.
Notice on the First Action issued in corresponding Chinese Patent Application No. 200810005436.4 dated Jul. 19, 2010.

* cited by examiner

*Primary Examiner*—N Drew Richards
*Assistant Examiner*—Mamadou Diallo
(74) *Attorney, Agent, or Firm*—Rossi, Kimms & McDowell LLP

(57) ABSTRACT

In a MIS-type semiconductor device having a trench gate structure, a withstand voltage is ensured without changing the thickness of a drift layer and on-resistance can be reduced without applying a high gate drive voltage. The lower half of a trench extending through a p-base region into an n-drift region is filled with a high-permittivity dielectric having a relative permittivity that is higher than that of a silicon oxide film, preferably a silicon nitride film, and an insulated gate structure including a gate insulator and a gate electrode is fabricated on the high-permittivity dielectric. The depth $d_2$ of the deepest portion of the high-permittivity dielectric is designed to be deeper than the depth $d_1$ of a depletion layer in the semiconductor region away from the high-permittivity dielectric.

25 Claims, 38 Drawing Sheets

SEMICONDUCTOR DEVICE AND METHOD FOR MANUFACTURING THE SAME

CROSS REFERENCE TO RELATED APPLICATIONS

This application claims priority from Japanese application Serial No. 2007-021828, filed on Jan. 31, 2007.

BACKGROUND OF THE INVENTION

A. Field of the Invention

The present invention relates to a MIS (Metal-Insulator-Semiconductor) type semiconductor device having a trench gate structure.

B. Description of the Related Art

FIG. 48 is a cross-sectional view showing a configuration of a MIS-type field effect transistor (FET) having a conventional trench gate structure. As shown in FIG. 48, in the conventional vertical trench gate-type n-channel MISFET, p-base region 2, $n^+$-source region 3 and $p^+$-contact region 4 are formed on a first principal surface side across n-drift region 1, while $n^+$-drain region 5 is formed on a second principal surface side across n-drift region 1. Gate insulator 6 and gate electrode 7 are formed in trench 8 that extends from the first principal surface through p-base region 2 into n-drift region 1.

Source electrode 9 is electrically connected to $n^+$-source region 3 and $p^+$-contact region 4, and insulated from gate electrode 7 by interlayer insulator 10. Drain electrode 11 is electrically connected to $n^+$-drain region 5. In FIG. 48, the broken line indicated by reference number 12 in p-base region 2 and the broken line indicated by reference number 13 in n-drift region 1 represent edges of a depletion layer when the MISFET is in the off-state.

FIG. 49 is a characteristic chart schematically showing the distribution of electric field strength at A-A' shown in FIG. 48. Reference characters B1, B2 and B3 on the ordinate axis in FIG. 49 correspond to edge 12 (B1) of the depletion layer in p-base region 2, pn junction 14 (B2) between p-base region 2 and n-drift region 1, and edge 13 (B3) of the depletion layer in n-drift region 1, respectively, at A-A' shown in FIG. 48. The withstand voltage of the MISFET corresponds to the area of the electric field distribution when the maximum electric field strength reaches a critical electric field strength in the characteristic chart shown in FIG. 49.

To reduce the gate-drain capacitance, it is known to provide thick $SiO_2$ on the bottom of the trench of the MISFET-type semiconductor device (see U.S. Patent Application Publication No. 2004/0166636, FIG. 3, for example). To reduce the gate-drain capacitance, it is also known to provide an oxide film under the gate electrode in the MISFET having a super junction structure in which a p-type impurity layer is provided adjacent to the n-drain/drift region (see U.S. Pat. No. 5,981,996, FIG. 1, for example). There is also a known semiconductor device provided with a field formation region made of $SiO_2$, $Si_3N_4$, $Ta_2O_5$, $SrTiO_3$, or $BaTiO_3$ across the n-drain/drift region and the p-body that form a pn junction (see WO 2004/102670, FIG. 7, for example).

There is also a known semiconductor device having a structure in which the lower part of the trench is filled with $SiO_2$ while the upper half of the trench is provided with the gate electrode (see JP-A-2005-302925, FIG. 1, for example). There is also a known transistor having a structure in which a dielectric layer made of $SiO_2$ or $Si_3N_4$ is provided under the gate electrode and a field plate is provided adjacent to the dielectric (see JP-A-2003-204064, FIGS. 4 and 5K, for example).

There is a need to reduce on-resistance in MIS-type power semiconductor devices, such as power MOS (Metal-Oxide-Semiconductor) FETs and IGBTs (Insulated Gate Bipolar Transistor). However, in the semiconductor device disclosed in U.S. Patent Application Publication No. 2004/0166636, it is apparent from the document that the thick $SiO_2$ on the bottom of the trench does not contribute to reduction in on-resistance. Therefore, although extending the N-epitaxial layer (drift region) may reduce its concentration, it increases the proportion of the resistance of the N-epitaxial layer (drift region) relative to the total on-resistance, so that an increased number of gate electrodes by employing the trench gate structure unfortunately cannot achieve sufficient reduced on-resistance as the whole device.

In the semiconductor device disclosed in U.S. Pat. No. 5,981,996, reducing on-resistance by providing the p-type impurity layer adjacent to the n-drain/drift region is contemplated, but the oxide film under the gate electrode does not contribute to reduction in on-resistance. When the numbers of carriers in the n-drain/drift region and the p-type impurity layer are not balanced, the depletion layer will not expand due to residual carriers in the off-state, resulting in reduced withstand voltage. To achieve desired complete depletion, it is necessary to precisely control the impurity concentrations in the n-drain/drift region and the p-type impurity layer.

In the semiconductor device disclosed in WO 2004/102670, as the field formation region is an idle region where no on-current flows, provision of the field formation region increases the width of a unit element, disadvantageously resulting in lower integration level. Furthermore, to fabricate this semiconductor device, it is necessary to form a trench for the gate electrode as well as a trench for the field formation region that is deeper than the gate electrode trench with these trenches tightly close to each other and separately fill these trenches, unfortunately resulting in very difficult fabrication.

In WO 2004/102670, simulation results on a diode structure are also disclosed (WO 2004/102670, FIG. 4). However, according to a study conducted by the inventors, it has been found that the structure shown in FIG. 7 in WO 2004/102670 would hardly provide effects comparable to the simulation results. The reasons for this follow.

In the structure shown in FIG. 3A in WO 2004/102670, the pn junction is formed by p-region and n-region of the same concentration, so that the depletion layer will sufficiently expand into both the p-region and n-region in the off-state. In contrast, in the structure shown in FIG. 7 in WO 2004/102670, the pn junction is formed by the p-body of high concentration and the n-drain/drift region of low concentration, so that the depletion layer expands only into the n-drain/drift region.

Even if the depletion layer is forced to expand into the p-body, the depletion layer will reach the source region, resulting in punch through. To avoid this, even if the p-body is extended to ensure a sufficient range for depletion layer expansion, the equipotential surface in the area around the gate electrode, which is located on the surface opposite to the field formation region on the pn junction, is pushed into the n-drain/drift region, so that desired expansion of the depletion layer comparable to the extension of the p-body cannot be achieved. Conversely, there is created an undesired portion around the gate electrode where the electric field concentrates, disadvantageously resulting in reduced withstand voltage. Furthermore, the extended p-body increases the length of the channel, disadvantageously resulting in increased on-resistance.

In the semiconductor device disclosed in JP-A-2005-302925, it is necessary to increase the thickness of the drift layer in order to increase the source-drain withstand voltage. To maintain or reduce on-resistance even when the drift layer is thicker, it is necessary to increase the gate drive voltage to be comparable to the source-drain withstand voltage or even higher. In the semiconductor device disclosed in JP-A-2003-204064, provision of the field plate disadvantageously prevents higher integration level.

To solve the above problems associated with the related art, an object of the invention is to provide a semiconductor device capable of ensuring the withstand voltage without changing the thickness of the drift layer and reducing on-resistance without applying a high gate drive voltage. Another object of the invention is to provide a method for easily manufacturing a semiconductor device having such properties.

The present invention is directed to overcoming or at least reducing the effects of one or more of the problems set forth above.

SUMMARY OF THE INVENTION

To solve the above problems and achieve the objects, in a first aspect the semiconductor device according to the invention comprises a drift region of a first conductivity type; a base region of a second conductivity type formed on a first principal surface side with the drift region sandwiched between a second principal surface and the base region; a source region of the first conductivity type formed on a surface layer of the base region of the second conductivity type; a drain region of the first conductivity type formed on the second principal surface side with the drift region sandwiched between the first principal surface and the drain region; a trench, formed adjacent to the source region, extending from the first principal surface through the base region into the drift region; an insulated gate structure including a gate insulator and a gate electrode formed in the upper half of the trench; and a high-permittivity dielectric buried in the lower half of the trench, wherein the relative permittivity of the high-permittivity dielectric is greater than that of a silicon oxide film.

In a second aspect, the semiconductor device according to the invention comprises a drift region of a first conductivity type; a base region of a second conductivity type formed on a first principal surface side with the drift region sandwiched between a second principal surface and the base region; a source region of the first conductivity type formed on a surface layer of the base region of the second conductivity type; a drain region of the first conductivity type formed on the second principal surface side with the drift region sandwiched between the first principal surface and the drain region; a trench, formed adjacent to the source region, extending from the first principal surface through the base region into the drift region; an insulated gate structure including a gate insulator and a gate electrode formed in the upper half of the trench; and a high-permittivity dielectric buried in the lower half of the trench, wherein the relative permittivity of the high-permittivity dielectric is greater than that of a silicon nitride film.

In a third aspect, the semiconductor device according to the invention comprises a drift region of a first conductivity type; a base region of a second conductivity type formed on a first principal surface side with the drift region sandwiched between a second principal surface and the base region; an emitter region of the first conductivity type formed on a surface layer of the base region of the second conductivity type; a collector region of the second conductivity type formed on the second principal surface side with the drift region sandwiched between the first principal surface and the collector region; a trench, formed adjacent to the emitter region, extending from the first principal surface through the base region into the drift region; an insulated gate structure including a gate insulator and a gate electrode formed in the upper half of the trench; and a high-permittivity dielectric buried in the lower half of the trench, wherein the relative permittivity of the high-permittivity dielectric is greater than that of a silicon oxide film.

In a fourth aspect, the semiconductor device according to the invention comprises a drift region of a first conductivity type; a base region of a second conductivity type formed on a first principal surface side with the drift region sandwiched between a second principal surface and the base region; an emitter region of the first conductivity type formed on a surface layer of the base region of the second conductivity type; a collector region of the second conductivity type formed on the second principal surface side with the drift region sandwiched between the first principal surface and the collector region; a trench, formed adjacent to the emitter region, extending from the first principal surface through the base region into the drift region; an insulated gate structure including a gate insulator and a gate electrode formed in the upper half of the trench; and a high-permittivity dielectric buried in the lower half of the trench, wherein the relative permittivity of the high-permittivity dielectric is greater than that of a silicon nitride film.

According to a fifth aspect, the semiconductor device according to the first or second aspects of the invention may be configured such that the high-permittivity dielectric is in contact with the drain region. According to a sixth aspect, the semiconductor device according to the third or fourth aspects of the invention may be configured such that the high-permittivity dielectric is in contact with the collector region. According to a seventh aspect, the semiconductor device according to any of the first through sixth aspects may be configured such that the deepest portion of the high-permittivity dielectric is deeper than the edge of a depletion layer extending into the drift region in the off-state. In an eighth aspect, the semiconductor device according to any of the first through seventh aspects may be configured such that the high-permittivity dielectric is in contact with the gate electrode.

The semiconductor device according to a ninth aspect of the invention comprises a drift region of a first conductivity type; a base region of a second conductivity type formed on a first principal surface side with the drift region sandwiched between a second principal surface and the base region; a source region of the first conductivity type formed on a surface layer of the base region of the second conductivity type; a drain region of the first conductivity type formed on the second principal surface side with the drift region sandwiched between the first principal surface and the drain region; a trench, formed adjacent to the source region, extending from the first principal surface through the base region into the drift region; an insulated gate structure including a gate insulator and a gate electrode formed in the upper half of the trench; and a plurality of high-permittivity dielectrics buried in the lower half of the trench, wherein the relative permittivity of at least one of the plurality of high-permittivity dielectrics is greater than that of a silicon oxide film.

The semiconductor device according to a tenth aspect of the invention comprises a drift region of a first conductivity type; a base region of a second conductivity type formed on a first principal surface side with the drift region sandwiched between a second principal surface and the base region; a source region of the first conductivity type formed on a surface layer of the base region of the second conductivity type; a drain region of the first conductivity type formed on the second principal surface side with the drift region sandwiched between the first principal surface and the drain region; a trench, formed adjacent to the source region, extending from the first principal surface through the base region into the drift region; an insulated gate structure including a gate insulator and a gate electrode formed in the upper half of the trench; and a plurality of high-permittivity dielectrics buried in the lower half of the trench, wherein the relative permittivity of at least one of the plurality of high-permittivity dielectrics is greater than that of a silicon nitride film.

The semiconductor device according to an eleventh aspect of the invention comprises a drift region of a first conductivity type; a base region of a second conductivity type formed on a first principal surface side with the drift region sandwiched between a second principal surface and the base region; an emitter region of the first conductivity type formed on a surface layer of the base region of the second conductivity type; a collector region of the second conductivity type formed on the second principal surface side with the drift region sandwiched between the first principal surface and the collector region; a trench, formed adjacent to the emitter region, extending from the first principal surface through the base region into the drift region; an insulated gate structure including a gate insulator and a gate electrode formed in the upper half of the trench; and a plurality of high-permittivity dielectrics buried in the lower half of the trench, wherein the relative permittivity of at least one of the plurality of high-permittivity dielectrics is greater than that of a silicon oxide film.

The semiconductor device according to a twelfth aspect of the invention comprises a drift region of a first conductivity type; a base region of a second conductivity type formed on a first principal surface side with the drift region sandwiched between a second principal surface and the base region; an emitter region of the first conductivity type formed on a surface layer of the base region of the second conductivity type; a collector region of the second conductivity type formed on the second principal surface side with the drift region sandwiched between the first principal surface and the collector region; a trench, formed adjacent to the emitter region, extending from the first principal surface through the base region into the drift region; an insulated gate structure including a gate insulator and a gate electrode formed in the upper half of the trench; and a plurality of high-permittivity dielectrics buried in the lower half of the trench, wherein the relative permittivity of at least one of the plurality of high-permittivity dielectrics is greater than that of a silicon nitride film.

According to a thirteenth aspect, the semiconductor device according to the ninth or tenth aspects of the invention may be configured such that one of the plurality of high-permittivity dielectrics is in contact with the drain region. According to a fourteenth aspect, the semiconductor device according to the eleventh or twelfth embodiments of the invention may be configured such that one of the plurality of high-permittivity dielectrics is in contact with the collector region. According to a fifteenth aspect, the semiconductor device in any of the ninth through fourteenth aspects may be configured such that one of the plurality of high-permittivity dielectrics is in contact with the gate electrode. According to a sixteenth aspect, the semiconductor device in any of the ninth through fifteenth aspects may be configured such that one of the plurality of high-permittivity dielectrics is a silicon oxide film. According to a seventeenth aspect, the semiconductor device according to any of the ninth through sixteenth aspects may be configured such that the deepest portion of the high-permittivity dielectric, provided at the deepest position, of the plurality of the high-permittivity dielectrics is deeper than the edge of a depletion layer extending into the drift region in the off-state.

A method for manufacturing a semiconductor device according to the invention comprises a trench formation step of providing a second semiconductor layer of the second conductivity type, which will be the base region of the second conductivity type, on a first semiconductor layer of the first conductivity type, which will be the drift region of the first conductivity type, and forming the trench from the surface of the second semiconductor layer through the second semiconductor layer into the first semiconductor layer; a high-permittivity dielectric formation step of filling the trench with a high-permittivity dielectric; a removal step of removing the upper half of the high-permittivity dielectric in the trench; a gate insulator formation step of forming the gate insulator at the portion, in the trench, where the high-permittivity dielectric has been removed; and a gate electrode formation step of filling the portion of the trench that is inside the gate insulator with the gate electrode.

Another method for manufacturing a semiconductor device according to the invention comprises a trench formation step of providing a second semiconductor layer of the second conductivity type, which will be the base region of the second conductivity type, on a first semiconductor layer of the first conductivity type, which will be the drift region of the first conductivity type and forming the trench from the surface of the second semiconductor layer through the second semiconductor layer into the first semiconductor layer; a first high-permittivity dielectric formation step of forming the first high-permittivity dielectric to cover at least the sidewall surface of the trench; a second high-permittivity dielectric formation step of filling the lower half of the portion, in the trench, which is inside the first high-permittivity dielectric, with the second high-permittivity dielectric; and a gate electrode formation step of filling the upper half of the portion, in the trench, which is inside the first high-permittivity dielectric, with the gate electrode. In this embodiment, the gate electrode formation step may be configured such that the gate electrode is formed by filling the upper half of the portion, in the trench, which is inside the first high-permittivity dielectric with the second high-permittivity dielectric.

According to the embodiments of the invention, the shape of the electric field distribution approaches from a triangular shape (see FIG. 49) to a rectangular shape (see FIG. 2) when the maximum electric field strength reaches the critical electric field strength in the off-state under the influence of polarized charges in the high-permittivity dielectric region under the gate electrode. The area of the electric field distribution increases accordingly, and this area corresponds to the withstand voltage, resulting in improved withstand voltage. Therefore, a higher withstand voltage is achieved even if the impurity concentration in the drift region is the same as the conventional value. That is, when the withstand voltage class is the same as the conventional value, on-resistance is reduced. Furthermore, although conventionally it has not been easy to fill the portion under the gate electrode, in the trench, with a high-permittivity dielectric having relative permittivity higher than that of a silicon nitride film under the gate electrode, according to the invention, the lower half of the trench is filled with a high-permittivity dielectric and the gate electrode is formed in the upper half of the same trench.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
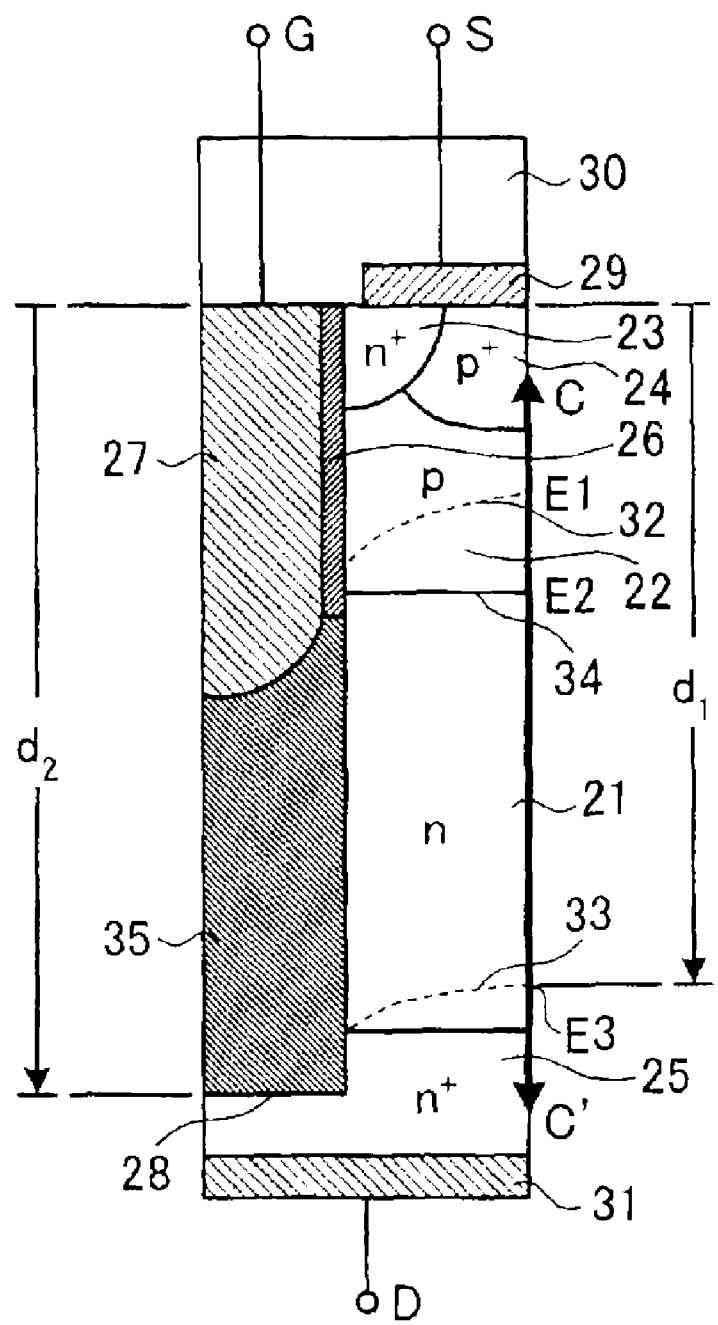
FIG. 1 is a cross-sectional view showing the configuration of the trench gate type MISFET according to a first embodiment of the invention.

With the semiconductor device and the method for manufacturing the same according to the invention, the withstand voltage can be ensured without changing the thickness of the drift layer and on-resistance can be reduced without applying a high gate drive voltage. With the method for manufacturing a semiconductor device according to the invention, a semiconductor device having such properties can be easily manufactured.

Preferable embodiments of the semiconductor device and the method for manufacturing the same according to the invention will be described in detail below with reference to the accompanying drawings. In the text and the accompanying drawings, layers and regions to which n or p is prefixed mean that they include electrons or holes as a majority carrier. The "+" sign affixed to n and p means that layers and regions with the "+" sign have higher impurity concentration than those without that sign. In the following description of the embodiments and the accompanying drawings, similar configurations have same reference characters and redundant description thereof will be omitted.

First Embodiment

FIG. 1 is a cross-sectional view showing the configuration of the trench gate type MISFET according to a first embodiment of the invention. FIG. 1 shows a half cell including the main portion of the semiconductor device. The overall configuration of the actual semiconductor device has the half cell configurations shown in FIG. 1 in succession on both sides such that adjacent configurations are symmetric with respect to the edge line there between (the same thing applies to FIG. 14).

As shown in FIG. 1, in the vertical trench gate type n-channel MISFET according to the first embodiment, p-base region 22 is formed on a first principal surface side across n-drift region 21, while n$^+$-drain region 25 is formed on a second principal surface side across n-drift region 21. N$^+$-source region 23 and p$^+$-contact region 24 are formed adjacent to each other on the surface layer of p-base region 22.

Trench 28, formed adjacent to n$^+$-source region 23, extends from the first principal surface through p-base region 22 and n-drift region 21 into n$^+$-drain region 25. The lower half of trench 28, specifically, the portion below pn junction 34 formed by p-base region 22 and n-drift region 21, is filled with high-permittivity dielectric 35. The relative permittivity of high-permittivity dielectric 35 is higher than that of a silicon oxide film ($SiO_2$, relative permittivity: 3.9).

Examples of high-permittivity dielectric 35 include a silicon nitride film ($Si_3N_4$, relative permittivity: up to 7), $Al_2O_3$ (relative permittivity: 8.5 to 10), silicate (ZrAlxOy, relative permittivity: 10 to 20), aluminate (HfAlxOy, relative permittivity: 10 to 20), $ZrO_2$ (relative permittivity: 11 to 18.5), $HfO_2$ (relative permittivity: 24), $Ta_2O_5$ (relative permittivity: up to 25), $La_2O_3$ (relative permittivity: 27), $CoTiO_3$ (relative permittivity: 40), $SrTiO_3$ (relative permittivity: 300), or $BaTiO_3$ (relative permittivity: up to 5000), but are not limited thereto. High-permittivity dielectric 35 is preferably a material with a relative permittivity higher than that of a silicon nitride film.

Gate insulator 26 is provided along part of a sidewall surface of trench 28 that is in contact with p-base region 22. The portion of trench 28 that is inside gate insulator 26 is filled with gate electrode 27. Gate electrode 27 is in contact with high-permittivity dielectric 35. High-permittivity dielectric 35 may not be in contact with gate electrode 27 or n$^+$-drain region 25. However, if high-permittivity dielectric 35 is in contact with one or both of gate electrode 27 and n$^+$-drain region 25, the electric potential of the portion in contact therewith is fixed, so that the electric potential distribution or the electric field distribution in high-permittivity dielectric 35 and consequently in n-drift region 21 is advantageously stabilized.

Source electrode 29 is electrically connected to n$^+$-source region 23 and p$^+$-contact region 24. On the other hand, source electrode 29 is insulated from gate electrode 27 by interlayer insulator 30. Drain electrode 31 is electrically connected to n$^+$-drain region 25. In FIG. 1, the broken line indicated by reference number 32 in p-base region 22 and the broken line indicated by reference number 33 in n-drift region 21 represent edges of a depletion layer when the MISFET is in an off-state.

The presence of the high-permittivity dielectric 35 gives rise to a situation in which polarized charges dominantly determine the electric field distribution in the off-state, so that, as shown in FIG. 1, the depletion layer near high-permittivity dielectric 35 extends such that it is pulled downward, that is, toward the lower end of high-permittivity dielectric 35. Thus, comparing the depth ($d_1$) of the depletion layer in the semiconductor region away from high-permittivity dielectric 35 with the depth ($d_2$) of the deepest portion of high-permittivity dielectric 35, $d_2$ is designed to be deeper than $d_1$.

As long as such design is employed, $d_2$ may be such a depth that the deepest portion of high-permittivity dielectric 35 terminates in n-drift region 21. However, as a shorter drift region effectively reduces on-resistance, the deepest portion of high-permittivity dielectric 35 preferably reaches n$^+$-drain region 25, as shown in FIG. 1.

Alternatively, $d_2$ may be designed to be shorter than $d_1$. In this case, as the length of the portion of n-drift region 21 that faces the sidewall of high-permittivity dielectric 35 becomes shorter, improvement in gate charge characteristics owing to reduced parasitic capacitance can be expected, provided that the same withstand voltage (same $d_1$) is maintained. In the case of $(d_1-d_2)/d_1<0.1$, as the $(d_1-d_2)$-thick portion of n-drift region 21 that does not face high-permittivity dielectric 35 serves as a buffer layer, the withstand voltage becomes higher than in the case where $d_2$ is deeper than $d_1$. Furthermore, as the width of n-drift region 21 increases by the thickness $(d_1-d_2)$, RonA ($\Omega$ cm$^2$) slightly decreases, thereby improving the tradeoff between the withstand voltage and RonA. However, in the case of $(d_1-d_2)/d_1>0.1$, electric field concentration occurs at the interface between n-drift region 21 and high-permittivity dielectric 35 at the corner of trench 28, so that the withstand voltage disadvantageously deteriorates in proportion to the decrease in ratio $(d_2/d_1)$.

Figure 2:
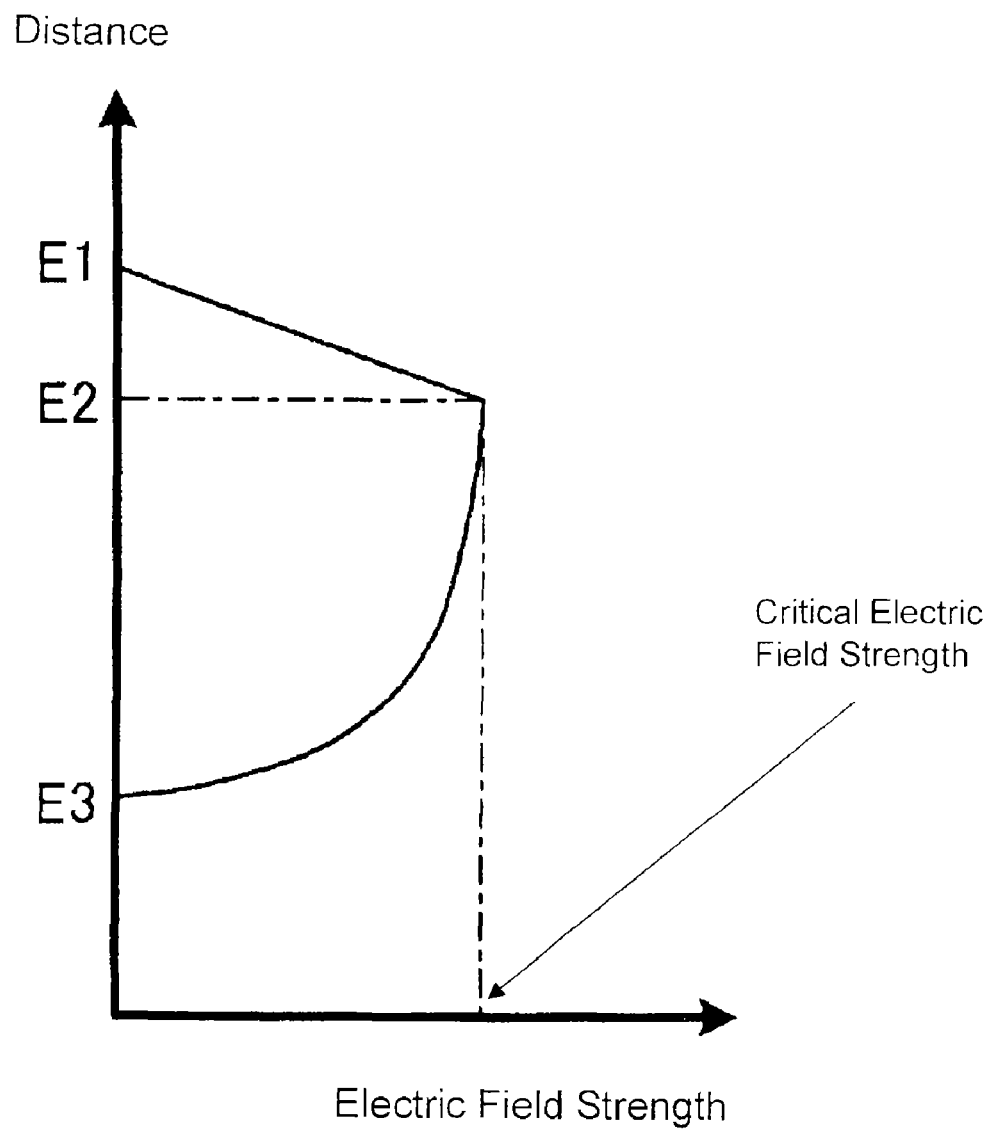
FIG. 2 is a characteristic chart diagrammatically showing the distribution of the electric field strength at C-C' shown in FIG. 1.
Figure 49:
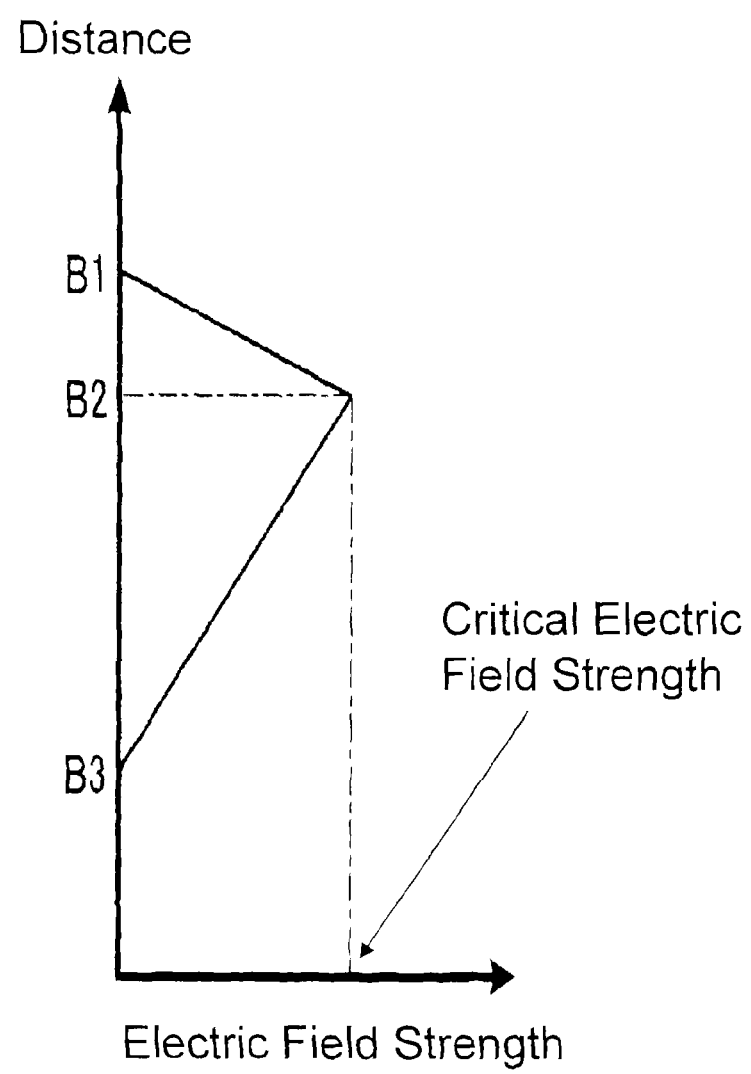
FIG. 49 is a characteristic chart diagrammatically showing the distribution of electric field strength at A-A' shown in FIG. 48.

FIG. 2 is a characteristic chart diagrammatically showing the distribution of the electric field strength at C-C' shown in FIG. 1. Reference characters E1, E2 and E3 on the ordinate axis in FIG. 2 correspond to edge 32 (E1) of the depletion layer in p-base region 22, pn junction 34 (E2) between p-base region 22 and n-drift region 21, and edge 33 (E3) of the depletion layer in n-drift region 21, respectively, at C-C' shown in FIG. 1. As shown in FIG. 2, the shape of the electric field distribution approaches a rectangular shape when the maximum electric field strength reaches a critical electric field strength. Accordingly, as the area of the electric field distribution when the maximum electric field strength reaches the critical electric field strength (corresponding to the withstand voltage) becomes greater than the conventional value (see FIG. 49), the withstand voltage is improved over the conventional value.

According to M. Bhatnagar et al., "Analysis of silicon carbide power device performance", (Proc. ISPSD (1991), page 176-180), the so-called silicon limit for on-resistance is given by the following equation:

$$RonA = 5.93 \times 10^{-9} \times Vb^{2.5} [\Omega cm^2]$$

where Vb [V] is the withstand voltage, Ron [$\Omega$] is on-resistance and A [cm$^2$] is the surface area of the chip.

When a material with a high relative permittivity is used as high-permittivity dielectric 35, on-resistance may become lower than the silicon limit. When on-resistance is lower than the silicon limit, there is no need to provide the field plate used in the semiconductor device disclosed in JP-A-2003-204064, allowing a smaller semiconductor device. Furthermore, unlike the semiconductor device disclosed in JP-A-2005-302925, there is no need to apply a high gate drive voltage.

Figure 3:
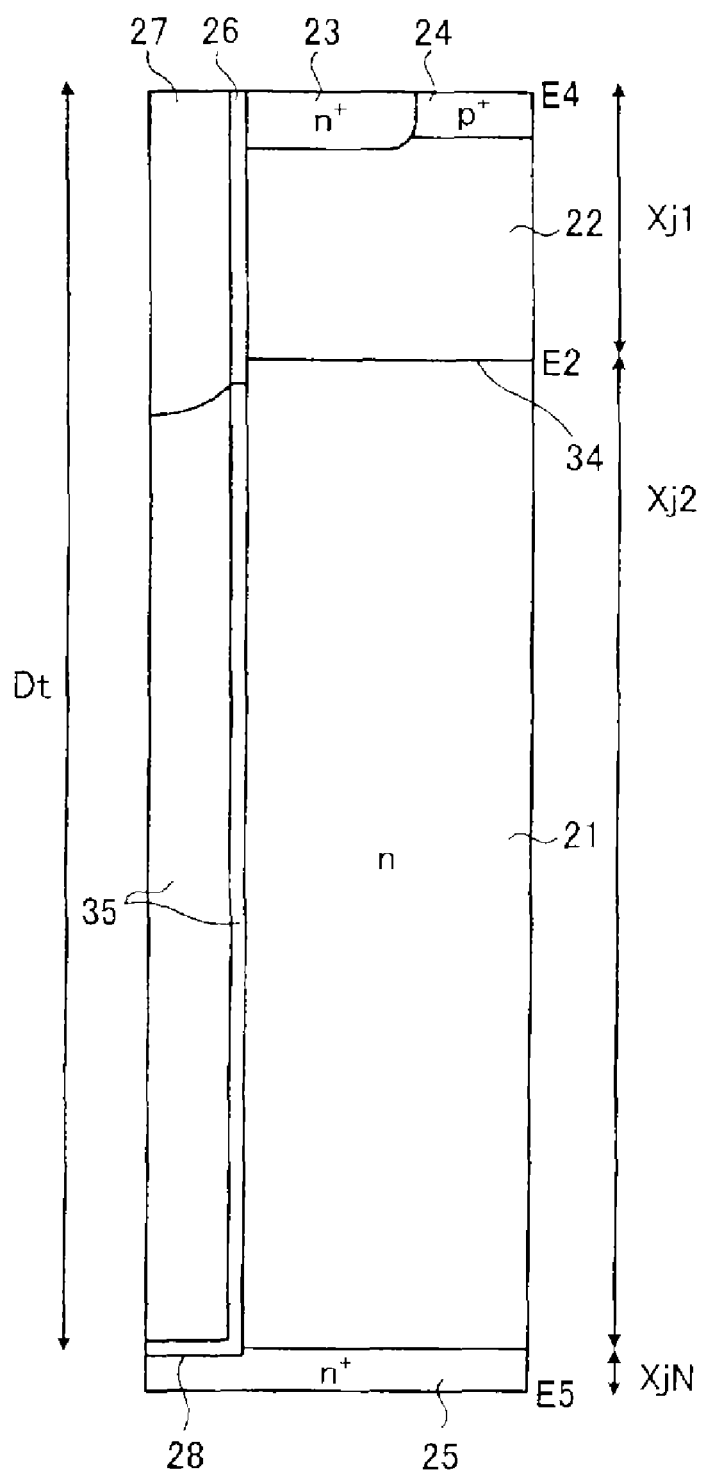
FIG. 3 is a cross-sectional view showing the configuration of the MISFET used in the simulation for analyzing the characteristics of the MISFET of FIG. 1.

Simulation results on characteristics of the MISFET configured as shown in FIG. 1 will now be described. FIG. 3 is a cross-sectional view showing the half cell of the MISFET used in the simulation. In FIG. 3, although high-permittivity dielectric 35 has a double-layer structure including an outer portion along the sidewall surface and bottom surface of trench 28 and an inner portion filled inside the outer portion, both the outer and inner portions are made of same material, so that they are effectively integrated. That is, the configuration shown in FIG. 3 is the same as that shown in FIG. 1.

The class of the withstand voltage is 60 V. As shown in FIG. 3, the depth Xj1 from the first principal surface to pn junction 34, the depth Xj2 from pn junction 34 to the interface between n-drift region 21 and n$^+$-drain region 25, and the depth XjN from the interface between n-drift region 21 and n$^+$-drain region 25 to the second principal surface, that is, the thickness of n$^+$-drain region 25 are 0.8 μm, 3.1 μm and 0.1 μm, respectively. The depth Dt from the first principal surface to the bottom of trench 28 (the deepest portion of the high-permittivity dielectric 35) is 3.9 μm. The thickness of gate insulator 26 is 500 angstroms. Gate electrode 27 is made of doped polysilicon. The impurity concentration in p-base region 22 is $2\times10^{17}$ cm$^{-3}$.

Figure 4:
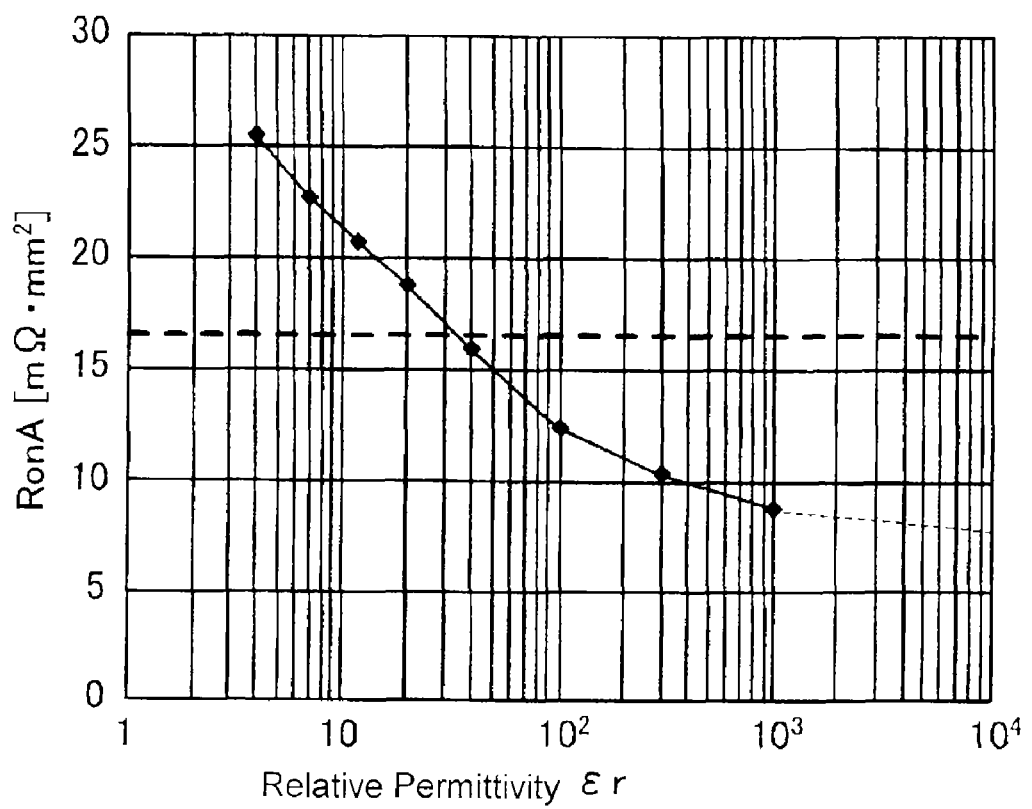
FIG. 4 is a characteristic chart showing simulation results on the relationship between the relative permittivity or of the high-permittivity dielectric and the on-resistance RonA in the MISFET of FIG. 3.

FIG. 4 is a characteristic chart showing simulation results on the relationship between the relative permittivity ∈r of the high-permittivity dielectric and the on-resistance RonA. In FIG. 4, the coarse broken line across the characteristic chart represents the silicon limit, while the fine broken line drawn in the range where the relative permittivity ∈r is greater than 1000 represents the portion extrapolated from the curve in the range below or equal to 1000. The simulation results shown in FIG. 4 have been obtained when the concentration in n-drift region 21 is adjusted such that the withstand voltage is set at 60 V. It is seen from FIG. 4 that when the class of the withstand voltage is 60 V and the relative permittivity of high-permittivity dielectric 35 is at least about 40, on-resistance becomes lower than the silicon limit. Therefore, in this class of withstand voltage, the relative permittivity of high-permittivity dielectric 35 is more preferably at least 40. For example, materials suitable for high-permittivity dielectric 35 include CoTiO$_3$, SrTiO$_3$ and BaTiO$_3$.

Figure 5:
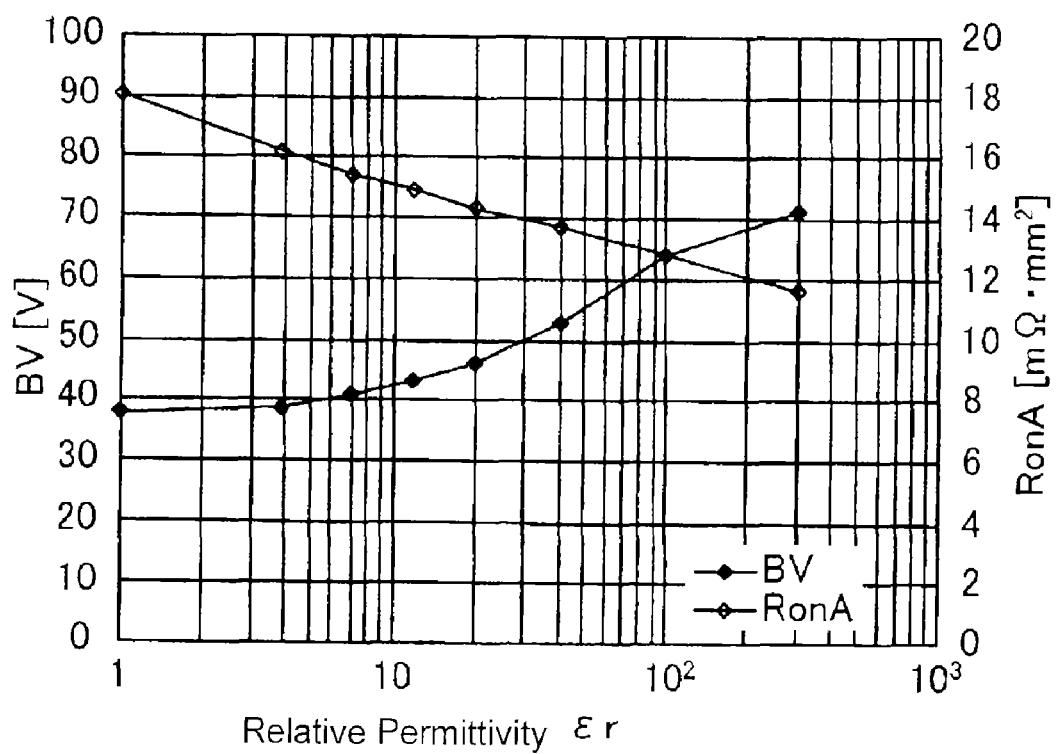
FIG. 5 is a characteristic chart showing simulation results on the relationship among the relative permittivity ∈r of the high-permittivity dielectric, the on-resistance RonA and the withstand voltage BV in the MISFET of FIG. 3.

FIG. 5 is a characteristic chart showing simulation results on the relationship among the relative permittivity ∈r of the high-permittivity dielectric, the on-resistance RonA and the withstand voltage BV. The simulation results shown in FIG. 5 have been obtained when the concentration in n-drift region is 21 of $2\times10^{16}$ cm$^{-3}$, and the gate-source voltage is 10 V, and the drain-source voltage is 0.1 V (the same conditions apply to simulation results shown in FIGS. 6 to 13). It is seen from FIG. 5 that by increasing the relative permittivity ∈r of high-permittivity dielectric 35, the withstand voltage can be increased while the on-resistance RonA can be reduced. Accordingly, an increased withstand voltage and reduced on-resistance RonA can be achieved even when the thickness, concentration and gate drive voltage of n-drift region 21 are the same as those conventionally used.

Figure 6:
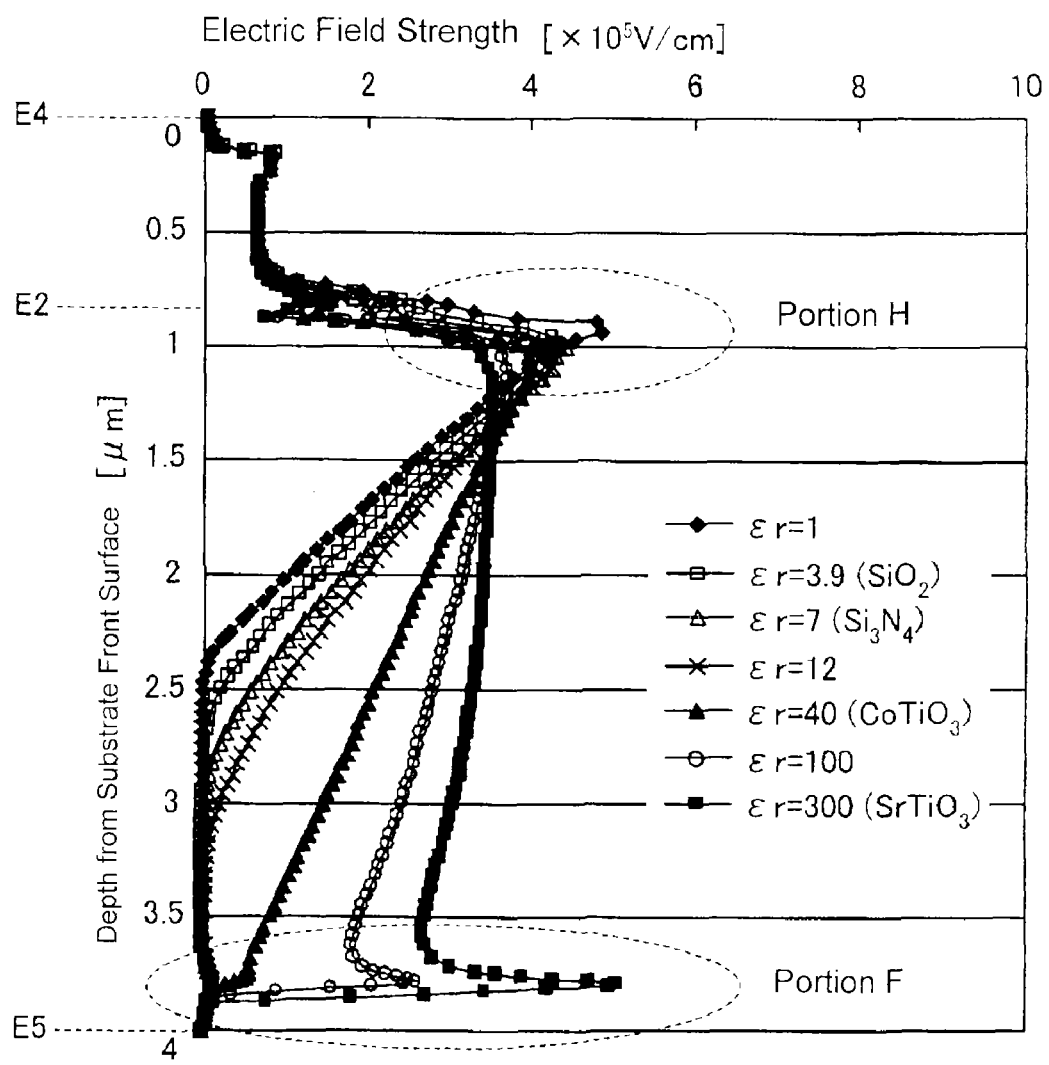
FIG. 6 is a characteristic chart showing simulation results on the relationship between the relative permittivity ∈r of the high-permittivity dielectric and the electric field distribution in the MISFET of FIG. 3.
Figure 7:
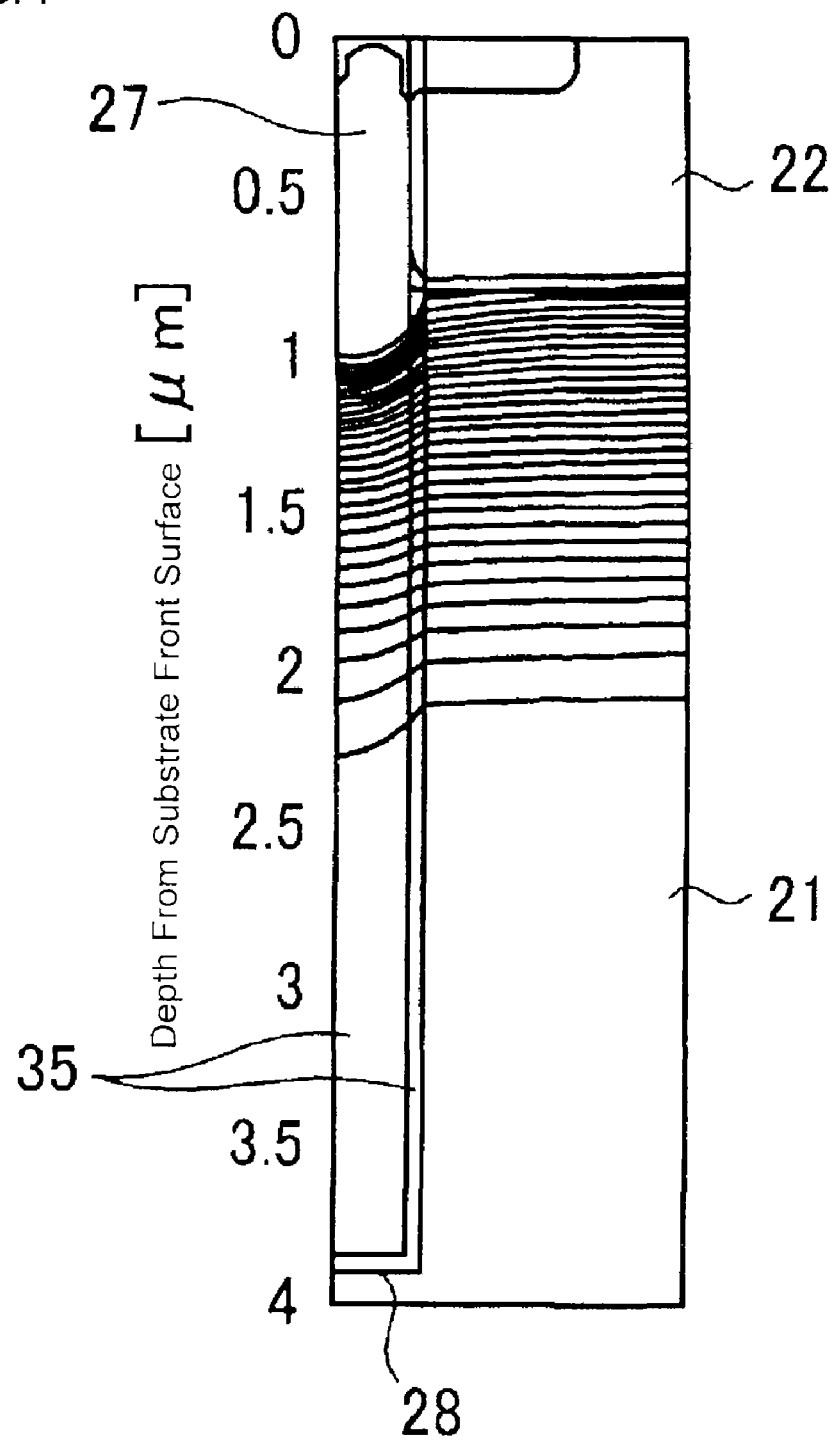
FIG. 7 is a cross-sectional view showing simulation results on the potential when the relative permittivity ∈r is set to 1 in the MISFET of FIG. 3.
Figure 8:
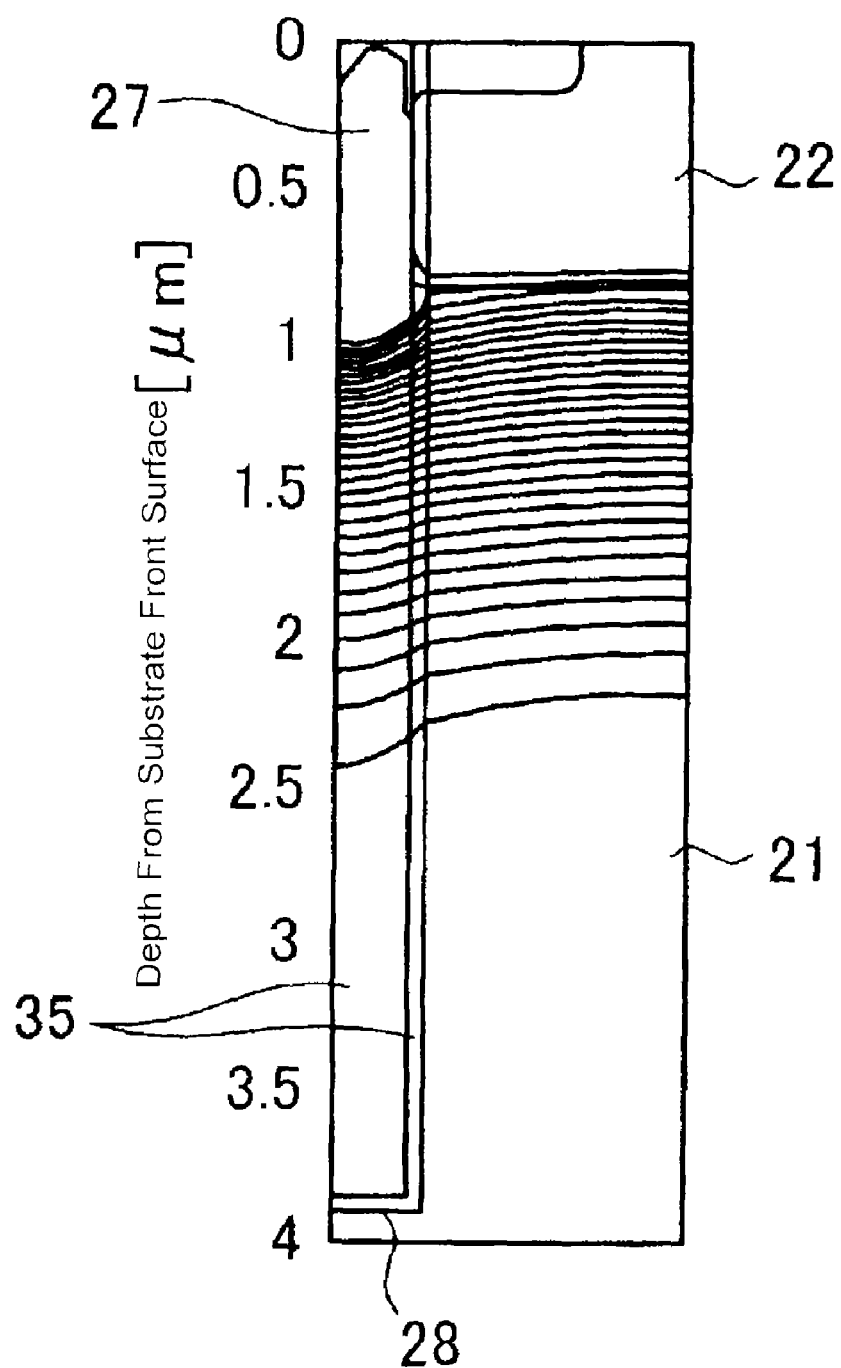
FIG. 8 is a cross-sectional view showing simulation results on the potential when the relative permittivity ∈r is set to 3.9 in the MISFET of FIG. 3.
Figure 9:
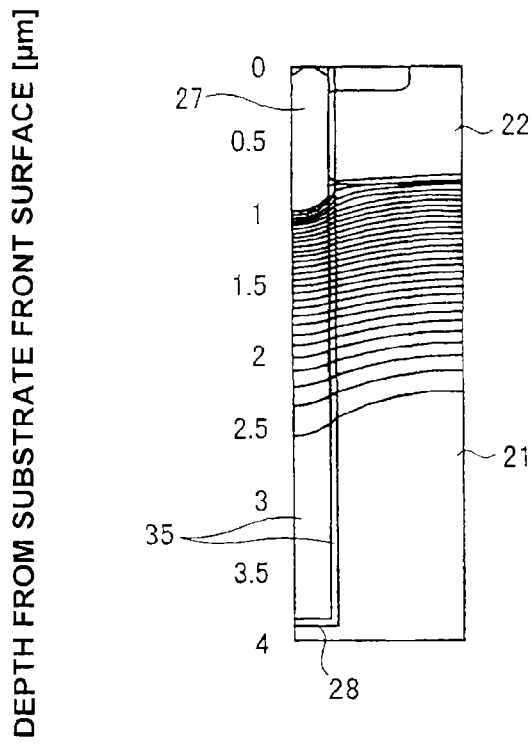
FIG. 9 is a cross-sectional view showing simulation results on the potential when the relative permittivity ∈r is set to 7 in the MISFET of FIG. 3.
Figure 10:
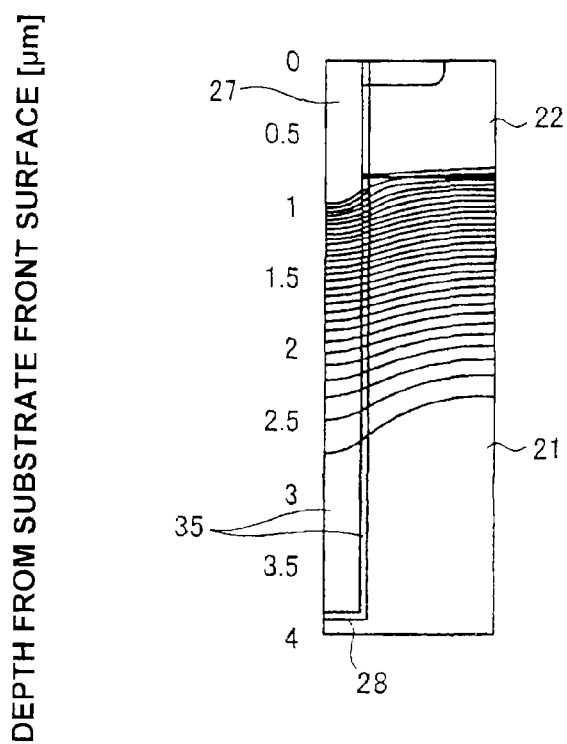
FIG. 10 is a cross-sectional view showing simulation results on the potential when the relative permittivity ∈r is set to 12 in the MISFET of FIG. 3.
Figure 11:
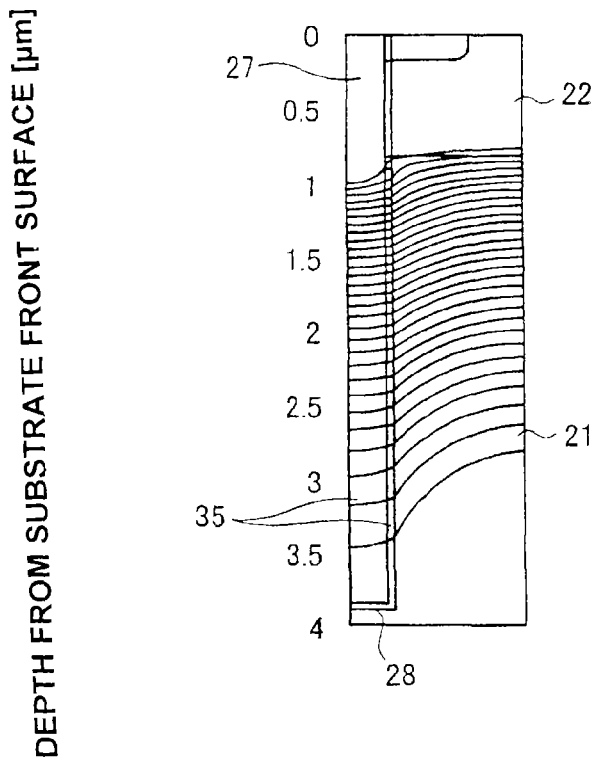
FIG. 11 is a cross-sectional view showing simulation results on the potential when the relative permittivity ∈r is set to 40 in the MISFET of FIG. 3.
Figure 12:
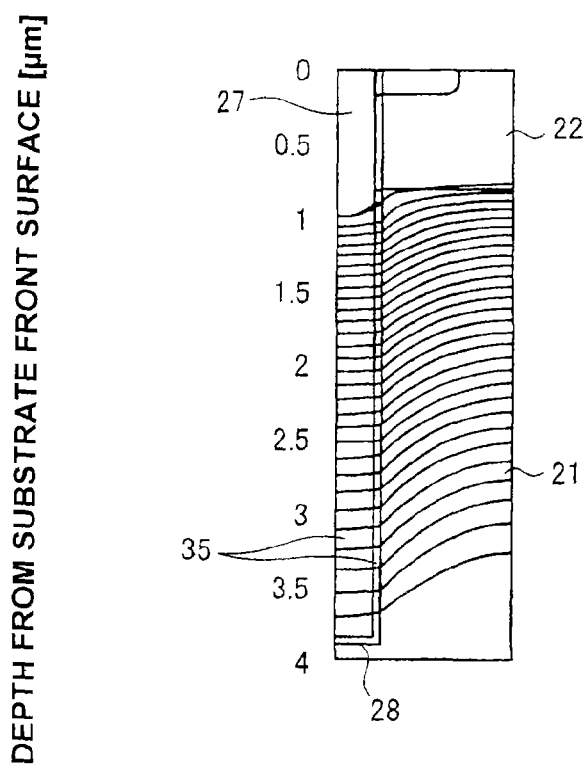
FIG. 12 is a cross-sectional view showing simulation results on the potential when the relative permittivity ∈r is set to 100 in the MISFET of FIG. 3.
Figure 13:
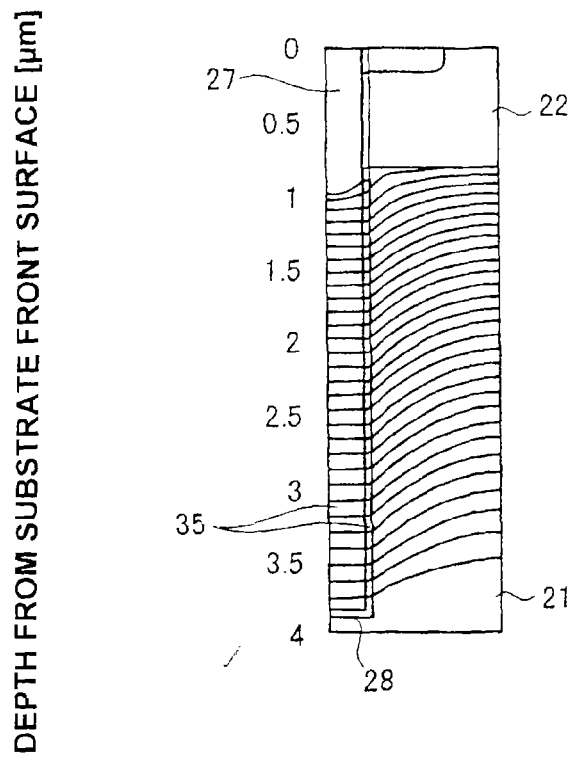
FIG. 13 is a cross-sectional view showing simulation results on the potential when the relative permittivity ∈r is set to 300 in the MISFET of FIG. 3.

FIG. 6 is a characteristic chart showing simulation results on the relationship between the relative permittivity ∈r of the high-permittivity dielectric and the electric field distribution. In FIG. 6, reference characters E4, E2 and E5 correspond to the first principal surface (E4), pn junction 34 (E2) between p-base region 22 and n-drift region 21, and the second principal surface (E5), respectively, in FIG. 3. Hereinafter, the first and second principal surfaces are referred to as a substrate front surface and a substrate back surface, respectively. It is seen from FIG. 6 that by increasing the relative permittivity ∈r of high-permittivity dielectric 35, the electric field in the portion H, which is in the vicinity of pn junction 34 (E2), is relaxed and the distribution of the electric field strength approaches a uniform value along the trench depth direction. That is, as described with reference to FIG. 2, increased relative permittivity ∈r causes the shape of the electric field distribution to approach a rectangular shape and hence increases the area of the electric field distribution, so that the withstand voltage is improved over the conventional value. Also, in the on-state, for the same reason, increased relative permittivity ∈r relaxes the drain-source electric potential gradient, resulting in reduced on-resistance RonA.

FIGS. 7, 8, 9, 10, 11, 12 and 13 are cross-sectional views showing simulation results on the potential in the MISFET when the relative permittivity ∈r is set to 1, 3.9, 7, 12, 40, 100 and 300, respectively. Each of their drawings shows a potential distribution when the withstand voltage BV is applied between the source electrode and the drain electrode, and in n-drift region 21 and p-base region 22, both edges of equipotential lines 40 are both edges of the depletion layer. It is seen from FIGS. 7 to 13 that the depletion layer expands deeper in the depth direction of trench 28 as the relative permittivity ∈r of high-permittivity dielectric 35 increases. Accordingly, the withstand voltage improves even when the thickness and concentration of n-drift region 21 are the same as conventional values. It is also seen that in the on-state, the drain-source electric potential gradient is relaxed, resulting in reduced on-resistance RonA.

Second Embodiment

Figure 14:
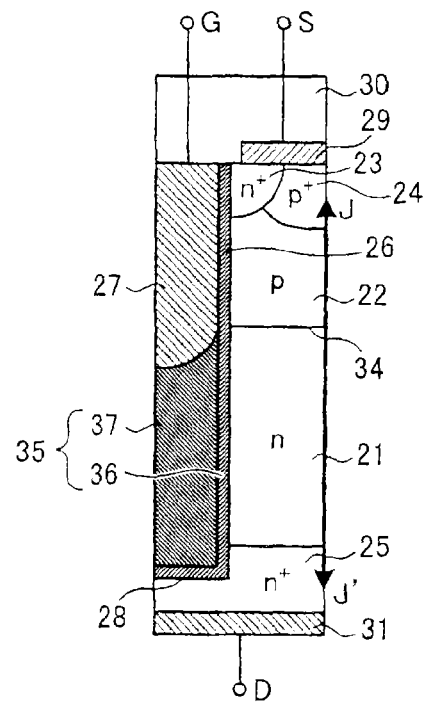
FIG. 14 is a cross-sectional view showing the configuration of the trench gate type MISFET according to a second embodiment of the invention.

FIG. 14 is a cross-sectional view showing the configuration of a half cell of the trench gate type MISFET according to a second embodiment of the invention. As shown in FIG. 14, the MISFET according to the second embodiment differs from the first embodiment in that high-permittivity dielectric 35 buried under gate electrode 27 has a double-layer structure including high-permittivity dielectric 36 in an outer portion and high-permittivity dielectric 37 in an inner portion. As other structures are the same as those of the first embodiment, they have the same reference characters and description thereof will be omitted.

The relative permittivity of high-permittivity dielectrics 36 and 37 in the outer and inner portions is advantageously selected to be higher than that of a silicon oxide film ($SiO_2$), preferably higher than that of a silicon nitride film ($Si_3N_4$). Examples of these high-permittivity dielectrics 36 and 37 include the various materials exemplified in the first embodiment, but not limited thereto. One of high-permittivity dielectrics 36 and 37 in the outer and inner portions may be a silicon oxide film ($SiO_2$). The first embodiment is a special case in which high-permittivity dielectrics 36 and 37 in the outer and inner portions are made of the same high-permittivity dielectric.

The distribution of the electric field strength at J-J' in FIG. 14 is similar to that diagrammatically shown in the characteristic chart of FIG. 2. Again in the second embodiment, when a material with a high relative permittivity is used for at least one of high-permittivity dielectrics 36 and 37, on-resistance may become lower than the silicon limit. In this case, there is no need to provide the field plate used in the semiconductor device disclosed in JP-A-2003-204064, allowing a smaller semiconductor device. Furthermore, unlike the semiconductor device disclosed in JP-A-2005-302925, there is no need to apply a high gate drive voltage.

Figure 15:
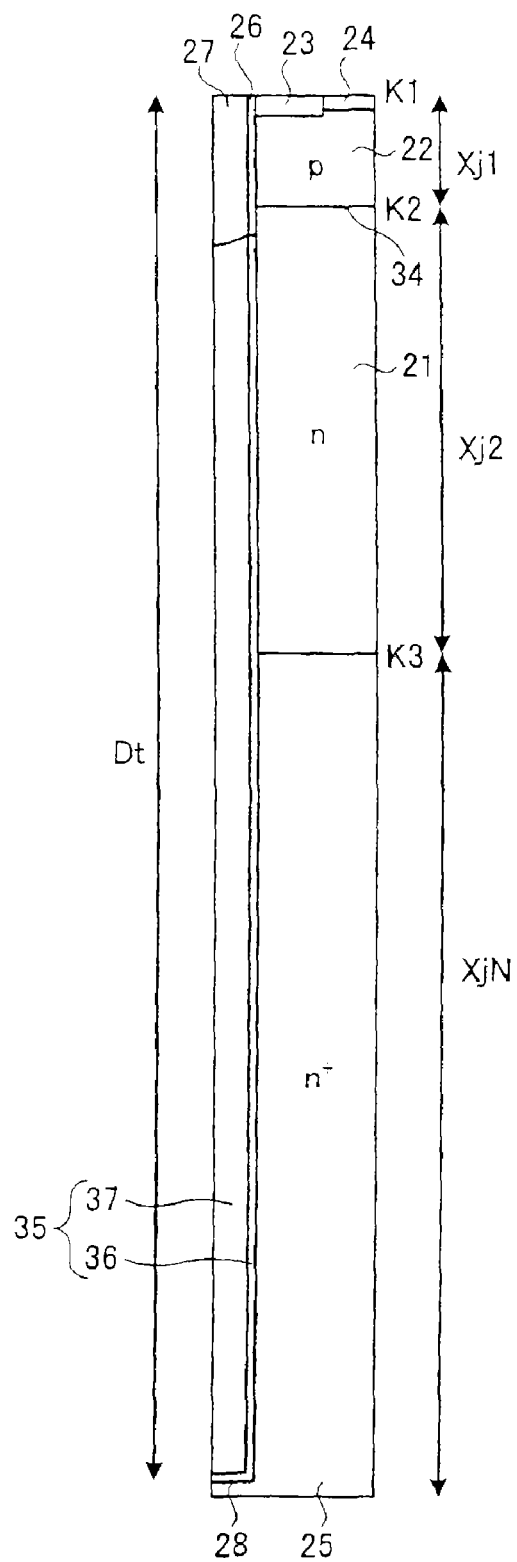
FIG. 15 is a cross-sectional view showing the configuration of the MISFET used in the simulation for analyzing the characteristics of the MISFET of FIG. 14.

Simulation results on characteristics of the MISFET configured as shown in FIG. 14 will now be described. FIG. 15 is a cross-sectional view showing a half cell of the MISFET used in the simulation. The class of the withstand voltage is 60 V.

As shown in FIG. 15, the depth Xj1 from the substrate front surface (the first principal surface) to pn junction 34, the depth Xj2 from pn junction 34 to the interface between n-drift region 21 and n+-drain region 25, and the depth XjN from the interface between n-drift region 21 and n+-drain region 25 to the substrate back surface (the second principal surface), that is, the thickness of n+-drain region 25 are 0.8 μm, 3.1 μm and 6.4 μm, respectively. The depth Dt from the first principal surface to the bottom of trench 28 (the deepest portion of high-permittivity dielectric 36 in the outer portion) is 10.2 μm. The thickness of gate insulator 26 is 500 angstroms. Gate electrode 27 is made of doped polysilicon. The impurity concentration in p-base region 22 is $2 \times 10^{17}$ $cm^{-3}$. High-permittivity dielectric 36 in the outer portion is a silicon oxide film ($SiO_2$).

Figure 16:
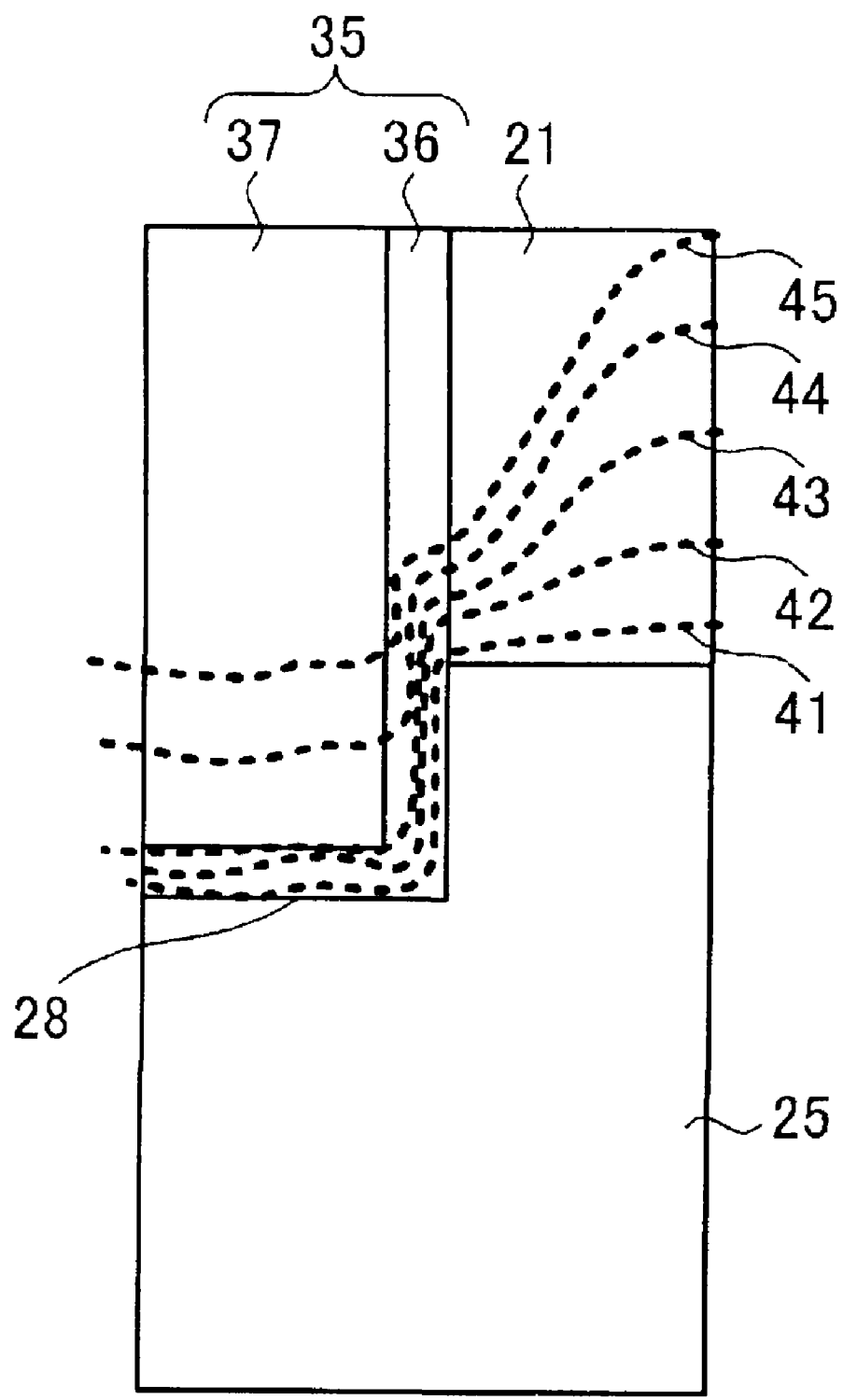
FIG. 16 is a partial, enlarged cross-sectional view for explaining the reason why the trench is deeper in the MISFET shown in FIG. 15.
Figure 17:
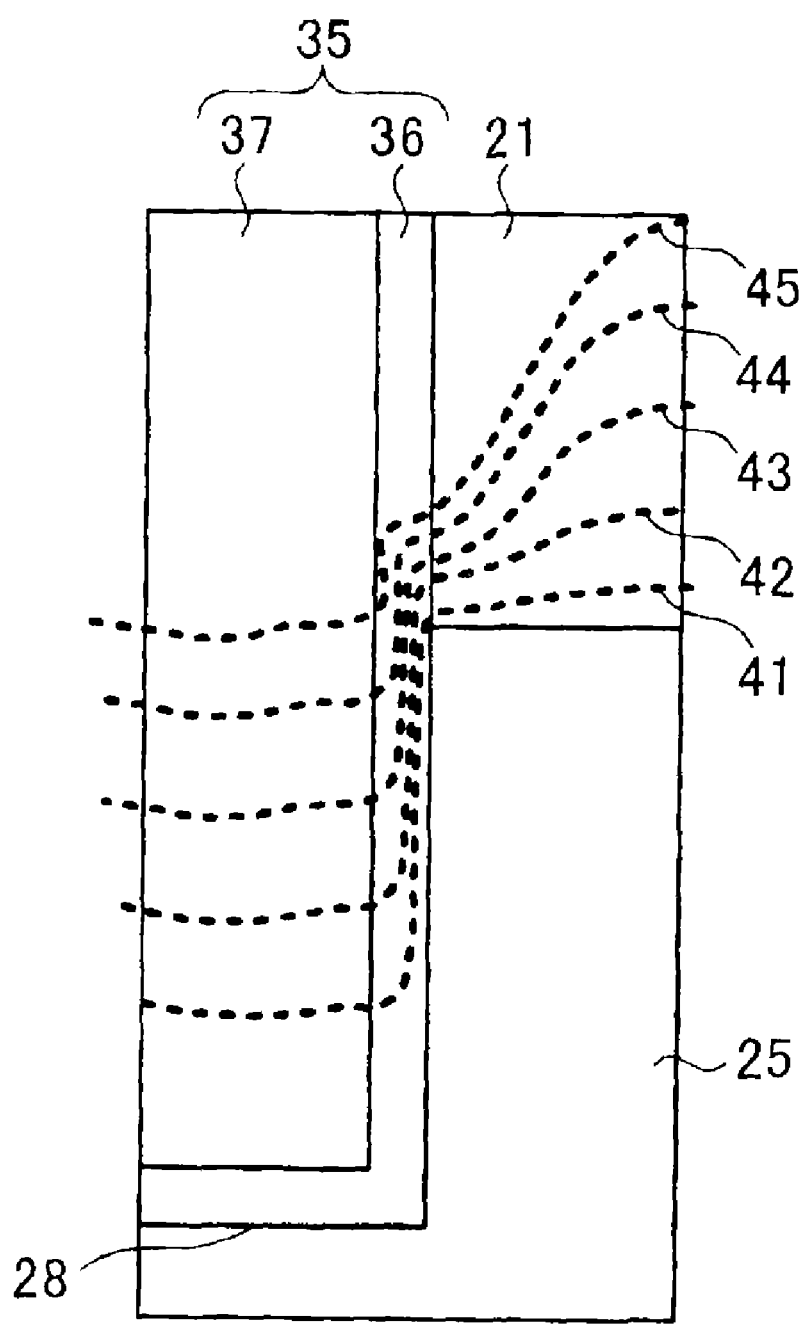
FIG. 17 is a partial, enlarged cross-sectional view for explaining the reason why the trench is deeper in the MISFET shown in FIG. 15.

The reason why trench 28 is deeper is as follows. As shown in FIG. 16, if trench 28 is shallower, among equipotential lines 41, 42, 43, 44 and 45, equipotential lines 41, 42 and 43 that are closer to the edge of the depletion layer are packed at the bottom of trench 28, resulting in electric field concentration and hence reduced withstand voltage. In contrast, as shown in FIG. 17, by sufficiently deepening trench 28 such that it extends into n+-drain region 25, equipotential lines 41, 42 and 43, which are closer to the edge of the depletion layer, will not reach the bottom of trench 28, which is high-permittivity dielectric 36 in the outer portion, thereby preventing the electric field concentration and being capable of maintaining a high withstand voltage. The simulation results shown in FIGS. 16 and 17 have been obtained when high-permittivity dielectric 37 in the inner portion is $SrTiO_3$.

Figure 18:
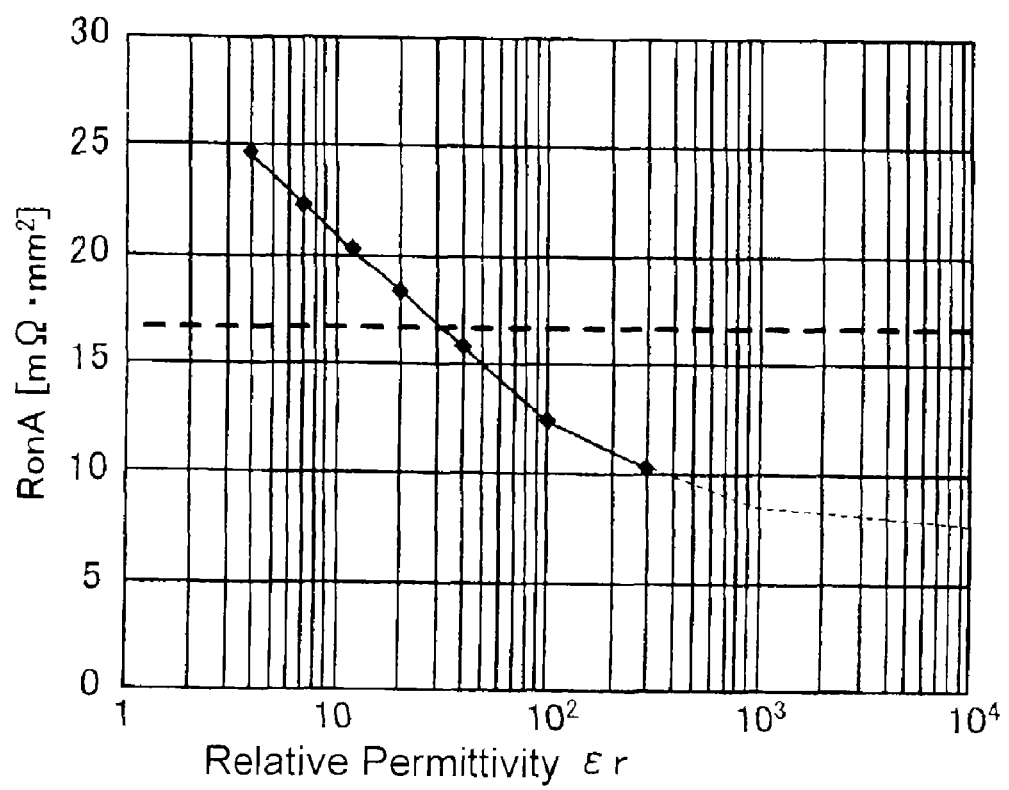
FIG. 18 is a characteristic chart showing simulation results on the relationship between the relative permittivity ∈r of the high-permittivity dielectric and the on-resistance RonA in the MISFET of FIG. 15.

FIG. 18 is a characteristic chart showing simulation results on the relationship between the relative permittivity ∈r of the high-permittivity dielectric in the inner portion and the on-resistance RonA. In FIG. 18, the coarse broken line across the characteristic chart represents the silicon limit, while the fine broken line drawn in the range where the relative permittivity ∈r is greater than 300 represents the portion extrapolated from the curve in the range below or equal to 300. The simulation results shown in FIG. 18 have been obtained when the concentration in n-drift region 21 is adjusted such that the withstand voltage is set at 60 V. As apparent from a comparison between FIGS. 18 and 4, it is seen that when the class of the withstand voltage is 60 V, the tendency of the dependence of on-resistance RonA on relative permittivity ∈r is similar to that in the first embodiment.

In the second embodiment, it is seen that when the relative permittivity of high-permittivity dielectric 37 in the inner portion is at least about 40, on-resistance becomes lower than the silicon limit. Therefore, in this withstand voltage class, the relative permittivity of high-permittivity dielectric 37 in the inner portion is more preferably at least 40. For example, materials suitable for high-permittivity dielectric 37 in the inner portion include $CoTiO_3$, $SrTiO_3$ and $BaTiO_3$.

Figure 19:
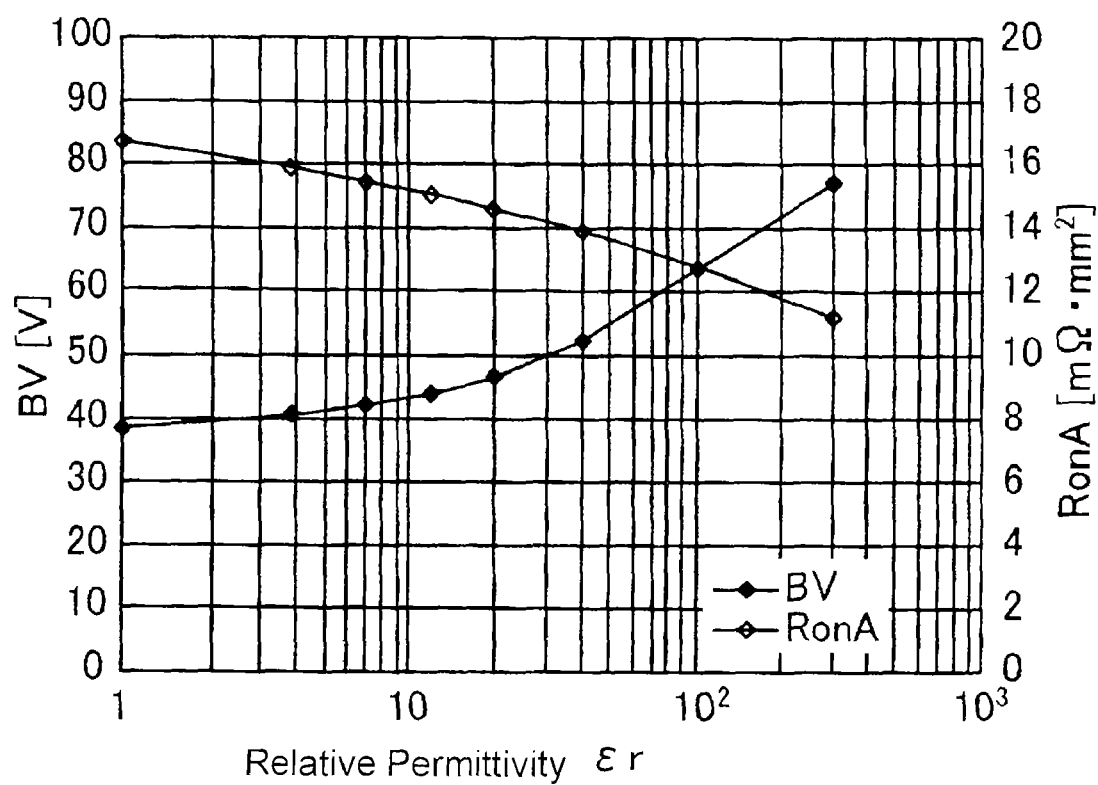
FIG. 19 is a characteristic chart showing simulation results on the relationship among the relative permittivity ∈r of the high-permittivity dielectric, the on-resistance RonA and the withstand voltage BV in the MISFET of FIG. 15.

FIG. 19 is a characteristic chart showing simulation results on the relationship among the relative permittivity ∈r of the high-permittivity dielectric in the inner portion, the on-resistance RonA and the withstand voltage BV. The simulation results shown in FIG. 19 have been obtained when the concentration in n-drift region 21 is $2 \times 10^{16}$ $cm^{-3}$, and gate-source voltage is 10 V, and the drain-source voltage is 0.1 V (the same conditions apply to simulation results shown in FIGS. 20 to 27). As apparent from a comparison between FIGS. 19 and 5, it is seen that the tendency of the dependence of the on-resistance RonA and withstand voltage BV on the relative permittivity ∈r is similar to that in the first embodiment.

Figure 20:
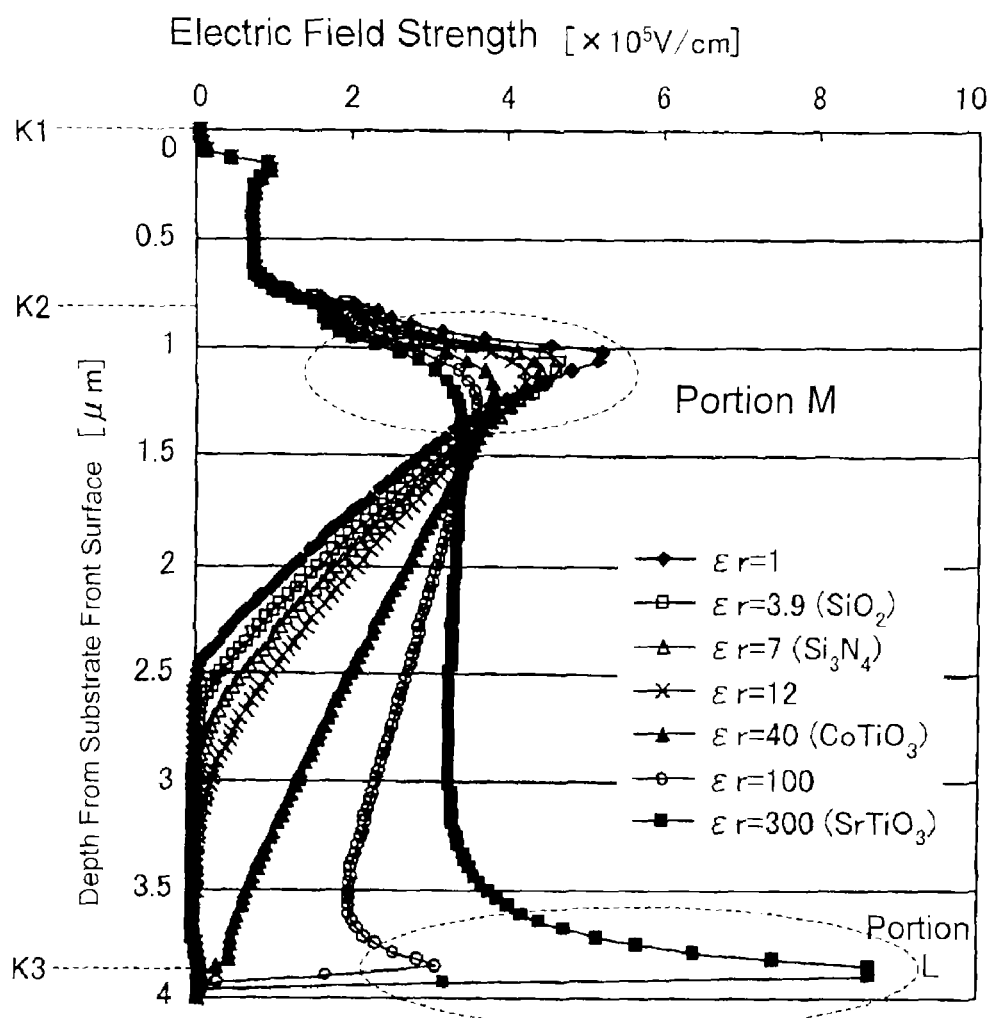
FIG. 20 is a characteristic chart showing simulation results on the relationship between the relative permittivity ∈r of the high-permittivity dielectric and the electric field distribution in the MISFET of FIG. 15.
Figure 21:
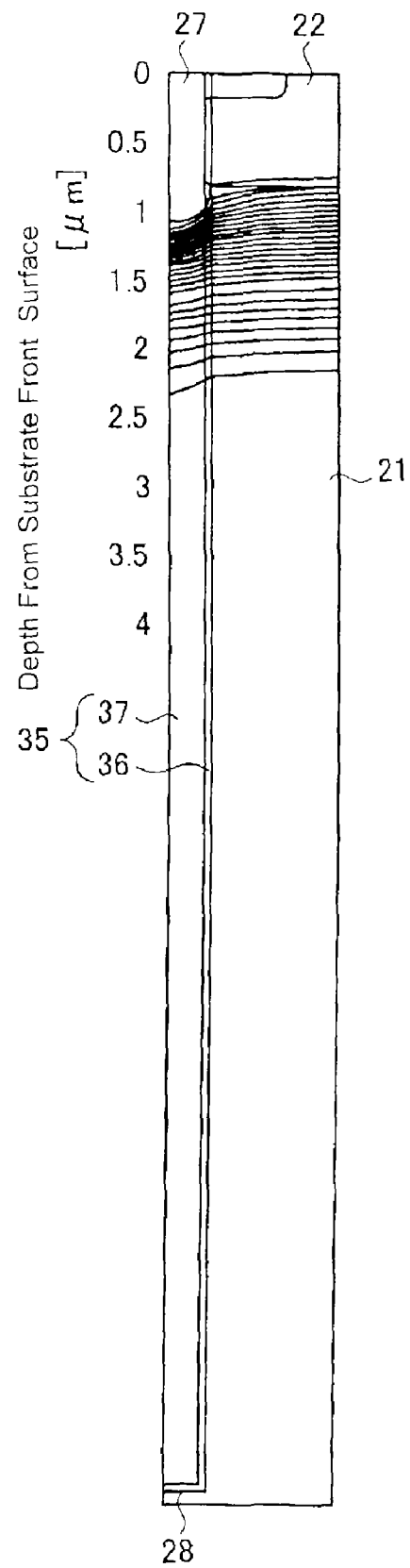
FIG. 21 is a cross-sectional view showing simulation results on the potential when the relative permittivity ∈r is set to 1 in the MISFET of FIG. 15.

FIG. 20 is a characteristic chart showing simulation results on the relationship between the relative permittivity ∈r of the high-permittivity dielectric in the inner portion and the electric field distribution. In FIG. 20, reference characters K1, K2 and K3 correspond to the substrate front surface (K1), pn junction 34 (K2) between p-base region 22 and n-drift region 21, and the interface (K3) between n-drift region 21 and n+-drain region 25, respectively, in FIG. 15. As is apparent from a comparison between FIGS. 20 and 6, it is seen that the tendency of the relationship between the relative permittivity ∈r of high-permittivity dielectric 37 in the inner portion and the electric field distribution is similar to that in the first embodiment.

FIGS. 21, 22, 23, 24, 25, 26 and 27 are cross-sectional views showing simulation results on the potential in the MISFET when the relative permittivity ∈r of high-permittivity dielectric 37 in the inner portion is set to 1, 3.9, 7, 12, 40, 100 and 300, respectively. Each of their drawings shows a potential distribution when the withstand voltage BV is applied between the source electrode and the drain electrode, and in n-drift region 21 and p-base region 22, both edges of equipotential lines 40 are both edges of the depletion layer. It is seen from FIGS. 21 to 27 that the depletion layer expands deeper in the depth direction of trench 28 as the relative permittivity ∈r of high-permittivity dielectric 37 in the inner portion increases. Accordingly, the withstand voltage improves even when the thickness and concentration of n-drift region 21 are the same as conventional values. It is also seen that in the on-state, the drain-source electric potential gradient is relaxed, resulting in reduced on-resistance RonA.

Figure 28:
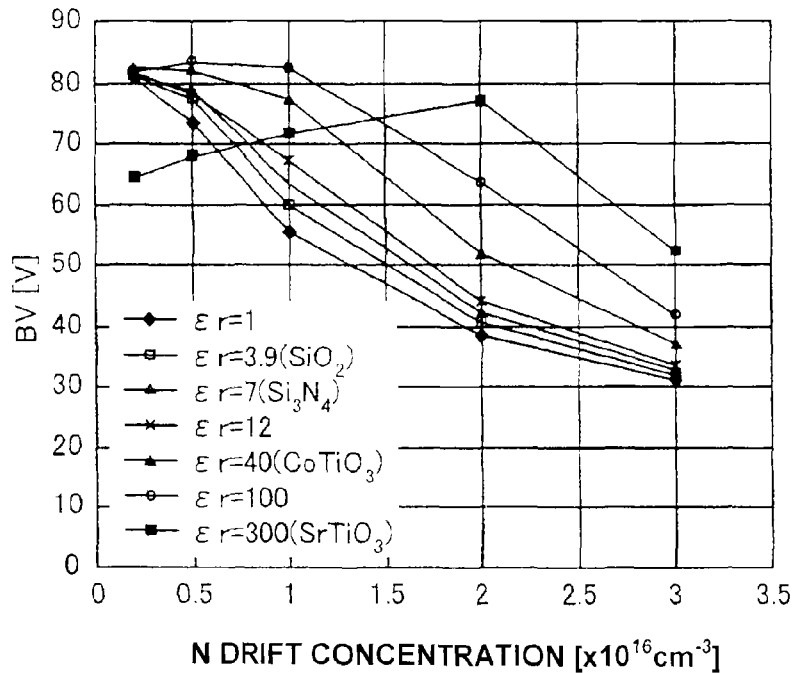
FIG. 28 is a characteristic chart showing simulation results on the relationship between the drift concentration and the withstand voltage BV in the MISFET of FIG. 15.
Figure 29:
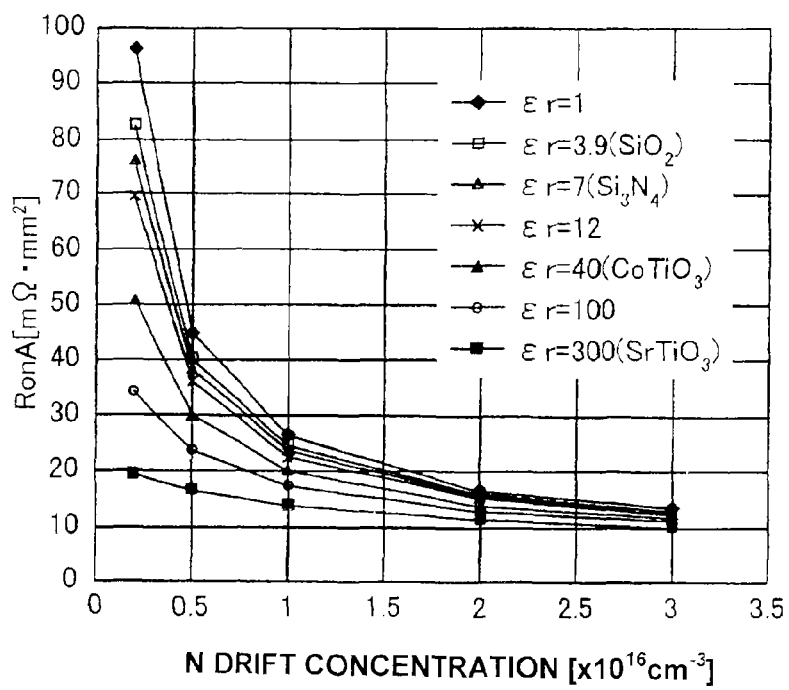
FIG. 29 is a characteristic chart showing simulation results on the relationship between the drift concentration and the on-resistance RonA in the MISFET of FIG. 15.
Figure 30:
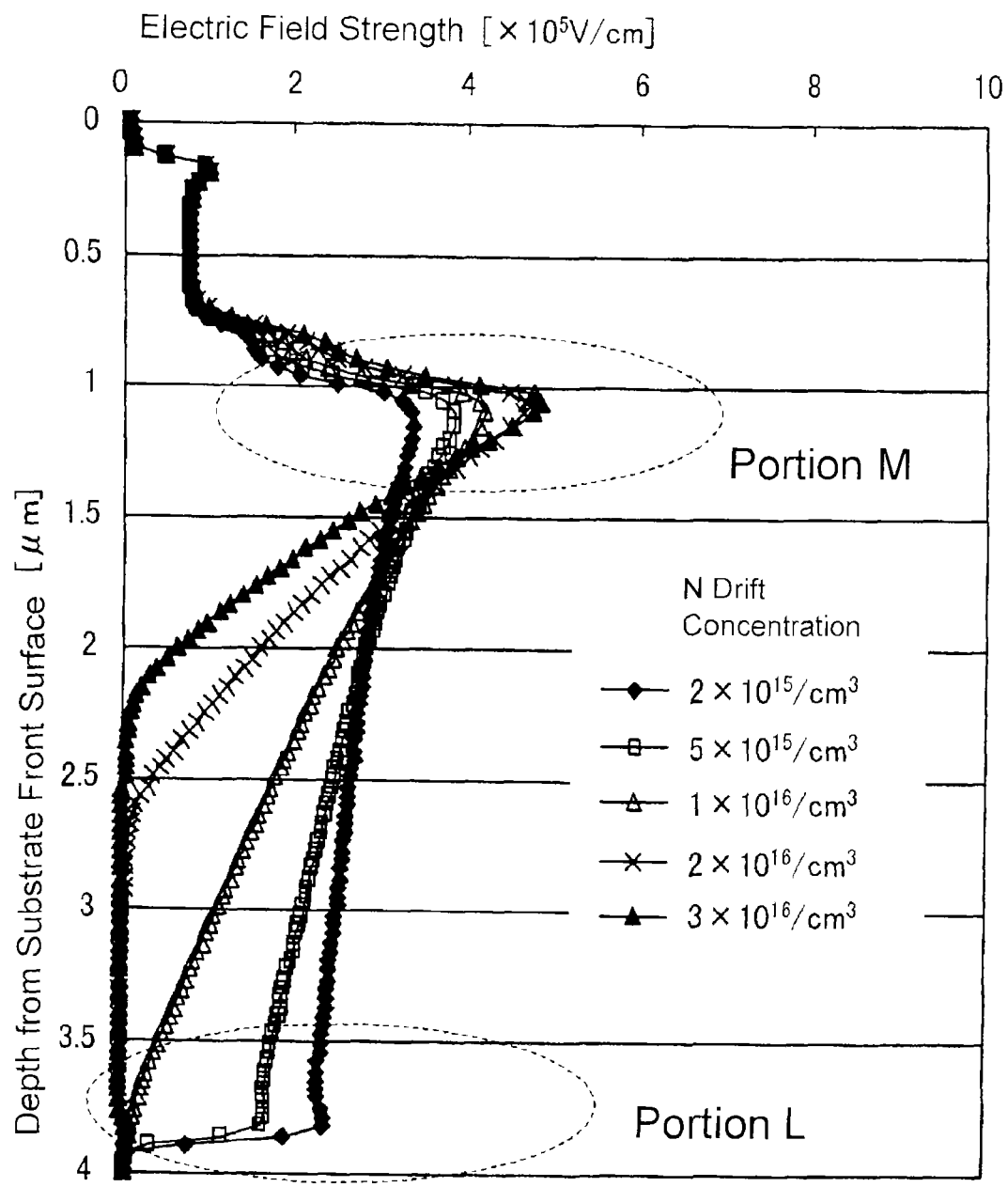
FIG. 30 is a characteristic chart showing simulation results on the relationship between the drift concentration and the electric field distribution when the relative permittivity ∈r of high-permittivity dielectric 37 in the inner portion in the MISFET of FIG. 15 is set to 3.9.
Figure 31:
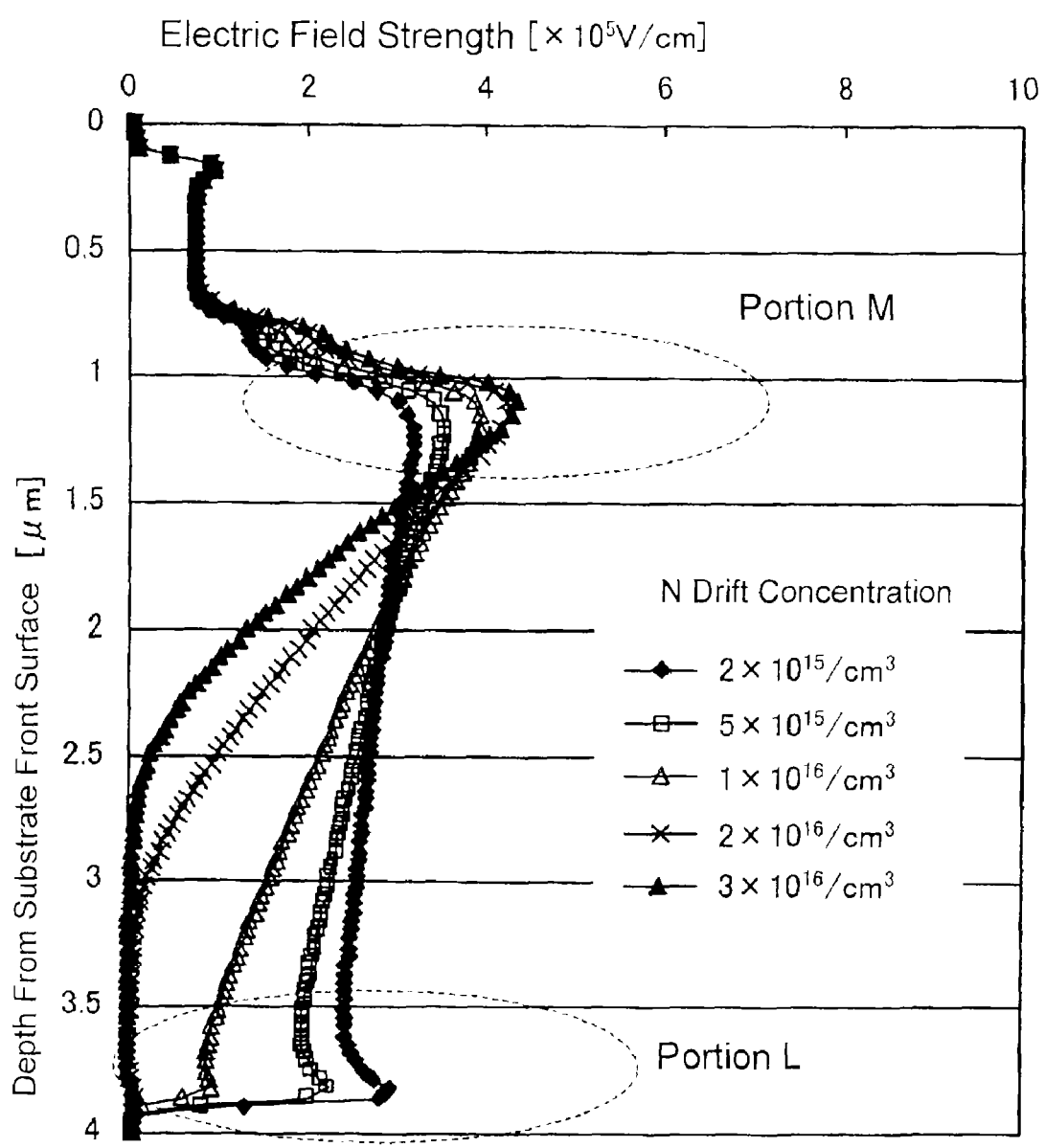
FIG. 31 is a characteristic chart showing simulation results on the relationship between the drift concentration and the electric field distribution when the relative permittivity ∈r of high-permittivity dielectric 37 in the inner portion in the MISFET of FIG. 15 is set to 12.
Figure 32:
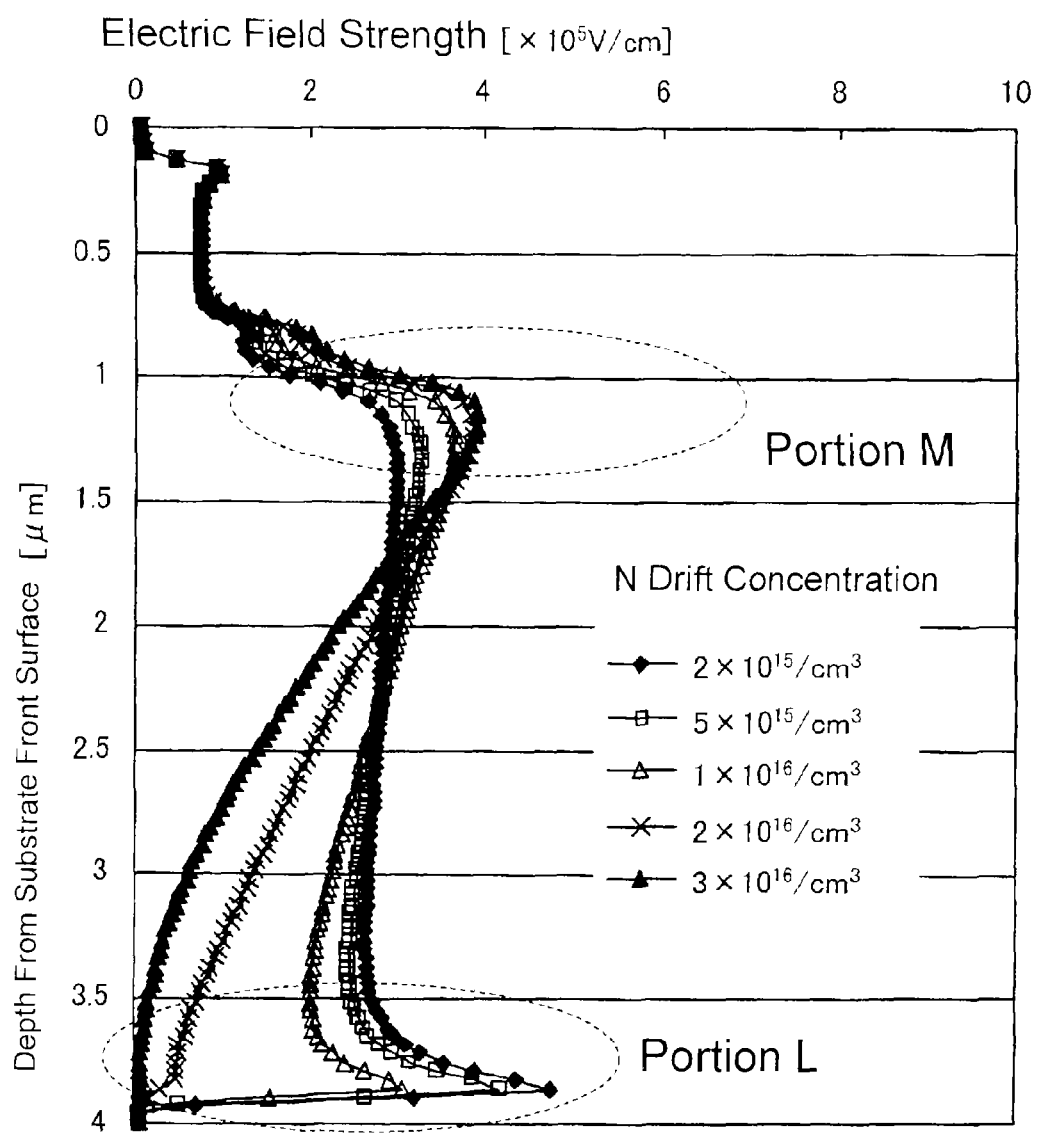
FIG. 32 is a characteristic chart showing simulation results on the relationship between the drift concentration and the electric field distribution when the relative permittivity ∈r of high-permittivity dielectric 37 in the inner portion in the MISFET of FIG. 15 is set to 40.
Figure 33:
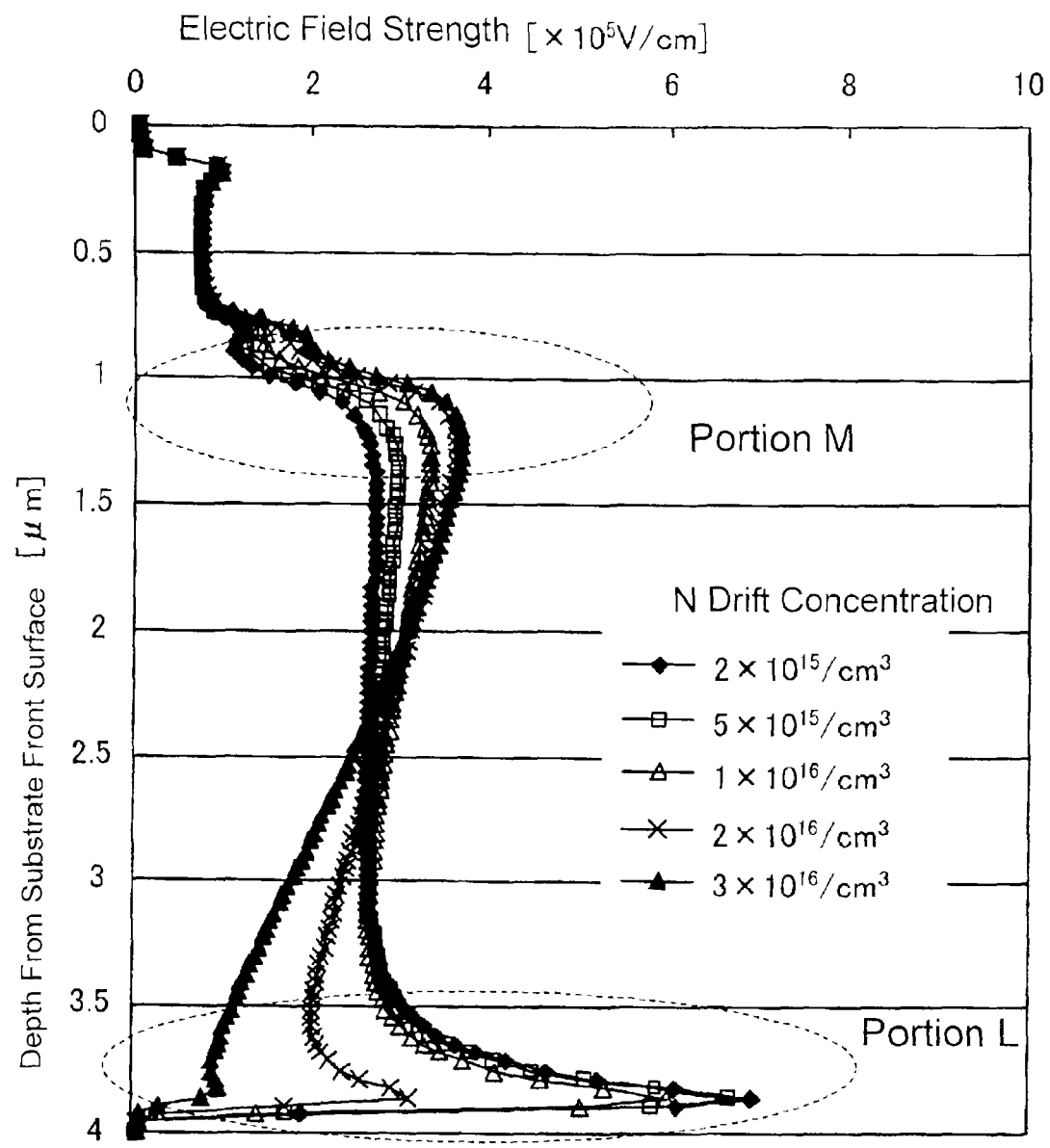
FIG. 33 is a characteristic chart showing simulation results on the relationship between the drift concentration and the electric field distribution when the relative permittivity ∈r of high-permittivity dielectric 37 in the inner portion in the MISFET of FIG. 15 is set to 100.
Figure 34:
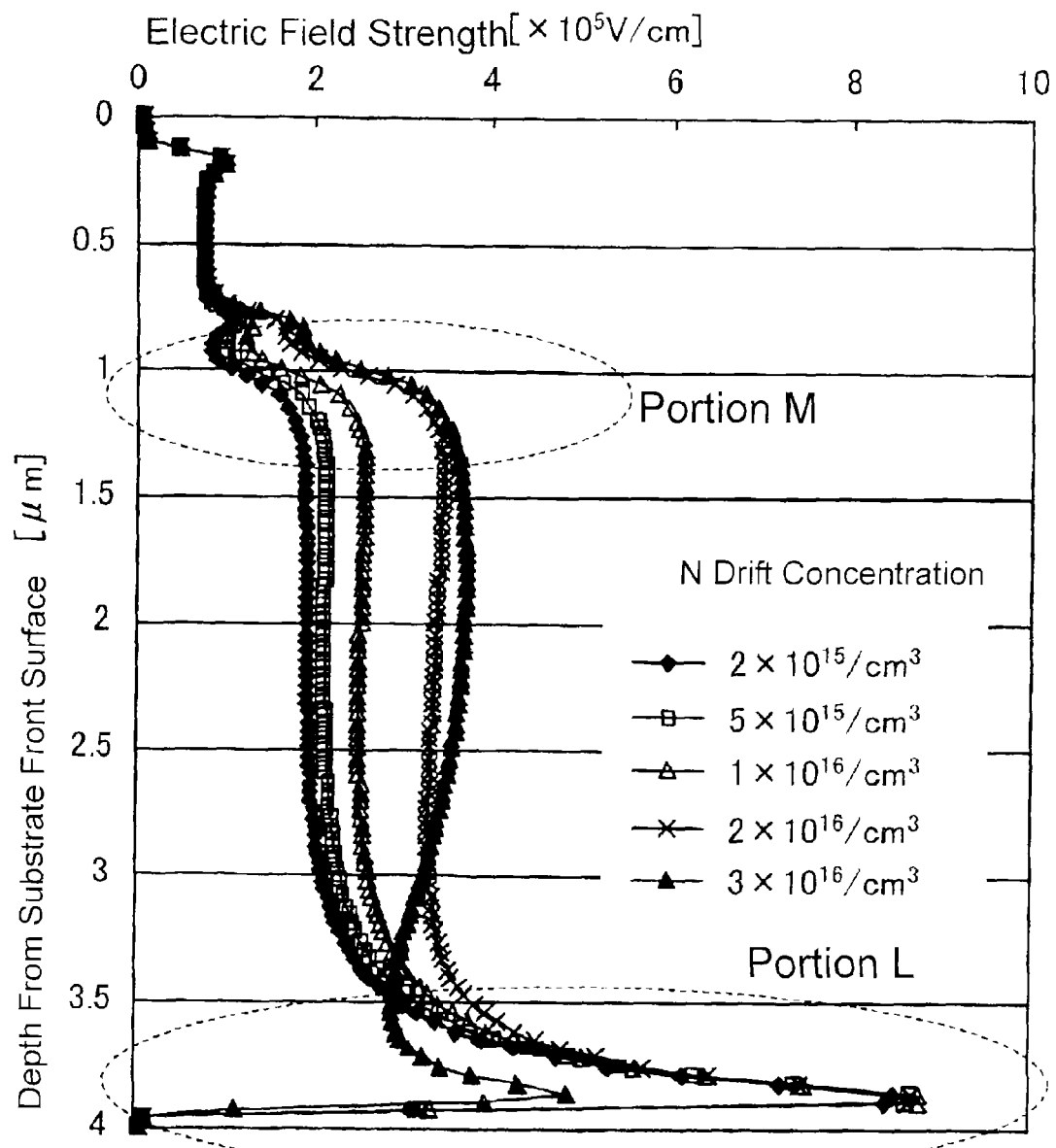
FIG. 34 is a characteristic chart showing simulation results on the relationship between the drift concentration and the electric field distribution when the relative permittivity ∈r of high-permittivity dielectric 37 in the inner portion in the MISFET of FIG. 15 is set to 300.

FIG. 28 is a characteristic chart showing simulation results on the relationship between the impurity concentration in the n-drift region and the withstand voltage BV. It is seen from FIG. 28 that the impurity concentration in n-drift region 21 at which the withstand voltage BV has a peak value shifts to the higher concentration side as the relative permittivity ∈r of high-permittivity dielectric 37 in the inner portion increases. For example, when the relative permittivity ∈r of high-permittivity dielectric 37 in the inner portion is 100, the withstand voltage BV has a peak value when the impurity concentration in n-drift region 21 (hereinafter referred to as a drift concentration) is $0.5 \times 10^{16}$ cm$^{-3}$. In contrast, when the relative permittivity ∈r of high-permittivity dielectric 37 in the inner portion is 300, the withstand voltage BV has a peak value when the drift concentration is $2 \times 10^{16}$ cm$^{-3}$, which shows a shift of the drift concentration to the higher concentration side as compared to the case in which the relative permittivity ∈r is 100. FIG. 29 is a characteristic chart showing simulation results on the relationship between the drift concentration and the on-resistance RonA.

The mechanism by which the withstand voltage BV has a peak value will now be described. FIGS. 30, 31, 32, 33 and 34 are characteristic charts showing simulation results on the relationship between the drift concentration and the electric field distribution when the relative permittivity ∈r of high-permittivity dielectric 37 in the inner portion is set to 3.9, 12, 40, 100 and 300, respectively. The drift concentration at which the withstand voltage has a peak value is hereinafter referred to as the concentration at the withstand voltage peak.

When the drift concentration is lower than the concentration at the withstand voltage peak, if the drift concentration is increased as shown in FIGS. 30 to 34, the electric field strength in the portion L maintains the critical value. However, the electric field strength in the portion M increases. This acts on the withstand voltage to be increased. Then, the increase in area of the electric field distribution due to the increase in electric field strength in the portion M exceeds the decrease in area of the electric field distribution due to the decrease in electric field strength in the portion L, so that the withstand voltage will increase as the drift concentration increases. When the drift concentration is higher than the concentration at the withstand voltage peak, as the decrease in area of the electric field distribution due to the decrease in electric field strength in the portion L exceeds the increase in area of the electric field distribution due to the increase in electric field strength in the portion M, the withstand voltage decreases. As the drift concentration is further increased, the electric field strength in the portion M reaches the critical value and the depletion layer terminates at a shallow level in trench 28, resulting in further reduced withstand voltage.

The tendency of the electric field strength in the portions L and M will now be described. As shown in FIGS. 30 to 34, for the same relative permittivity ∈r of high-permittivity dielectric 37 in the inner portion, the lower the drift concentration, the higher the electric field strength in the portion L. For the same drift concentration, the higher the relative permittivity ∈r of high-permittivity dielectric 37 in the inner portion, the higher the electric field strength in the portion L (the reason for this will be described later), so that the limit of the drift concentration at which the electric field strength in L portion is maintained at the critical value shifts to the higher concentration side. In the portion M, for the same drift concentration, the higher the relative permittivity ∈r of high-permittivity dielectric 37 in the inner portion, the lower the electric field strength because high-permittivity dielectric 37 relaxes the electric field.

From the above description, as the relative permittivity ∈r of high-permittivity dielectric 37 in the inner portion becomes higher, where the withstand voltage BV has the peak value shifts to the higher concentration side of the drift concentration. When the drift concentration is lower than the concentration at the withstand voltage peak, the higher the relative permittivity ∈r of high-permittivity dielectric 37 in the inner portion, the significantly higher the withstand voltage. This is because, as described above, the higher the relative permittivity ∈r, the lower the electric field strength in the portion M, so that the withstand voltage can be increased to the critical electric field strength.

It will now be explained why the electric field strength in the portion L becomes higher as the relative permittivity ∈r of high-permittivity dielectric 37 in the inner portion goes higher for the same drift concentration. For the purpose of the explanation, in FIGS. 22 and 27, let a1 be the maximum depth of the equipotential line at the edge of the depletion layer in high-permittivity dielectric 37 in the inner portion and let a2 be the distance from the substrate front surface to the edge of the depletion layer in n-drift region 21. As apparent from a comparison between FIGS. 22 and 27, it is found that the difference between a1 and a2 when the relative permittivity ∈r of high-permittivity dielectric 37 in the inner portion is higher (FIG. 27, relative permittivity ∈r: 300) is greater than that when the relative permittivity ∈r of high-permittivity dielectric 37 in the inner portion is lower (FIG. 22, relative permittivity ∈r: 3.9).

Figure 22:
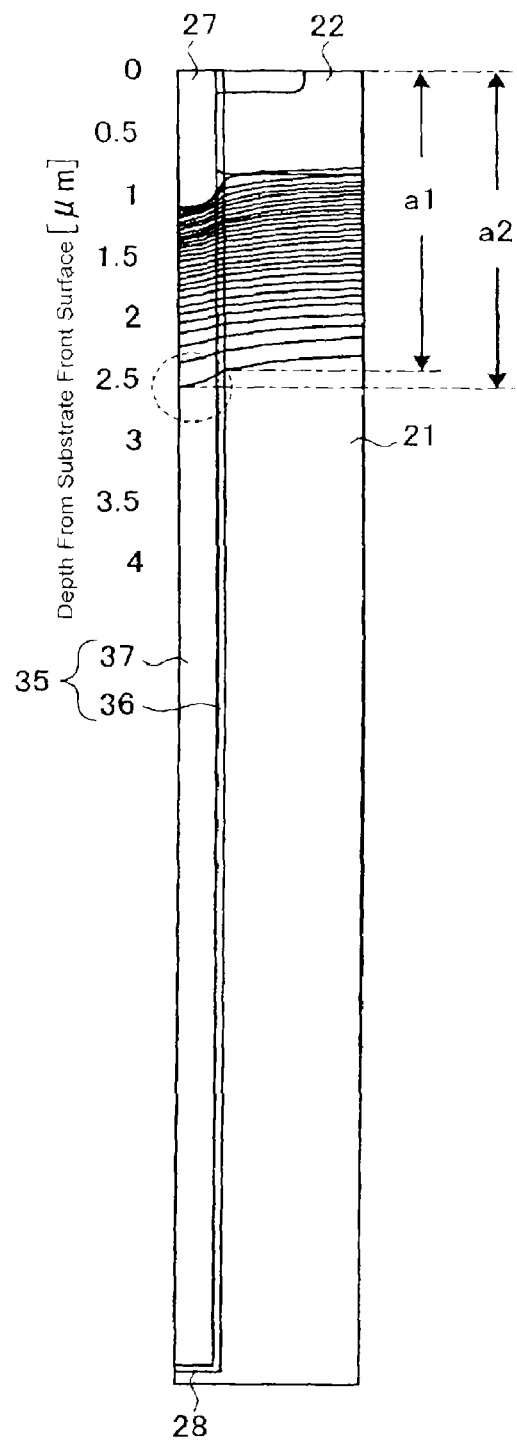
FIG. 22 is a cross-sectional view showing simulation results on the potential when the relative permittivity ∈r is set to 3.9 in the MISFET of FIG. 15.
Figure 23:
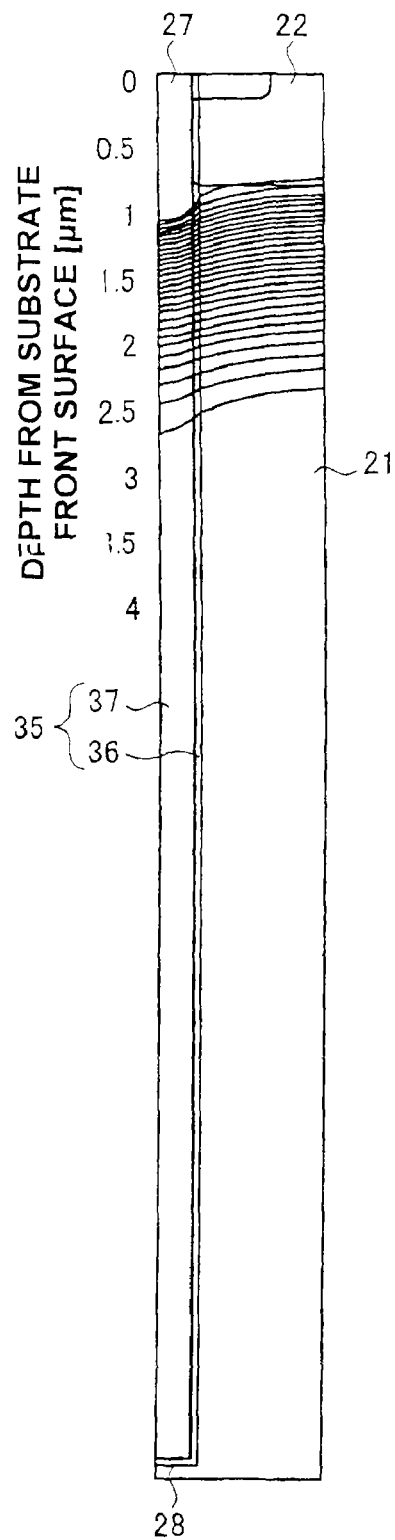
FIG. 23 is a cross-sectional view showing simulation results on the potential when the relative permittivity ∈r is set to 7 in the MISFET of FIG. 15.
Figure 24:
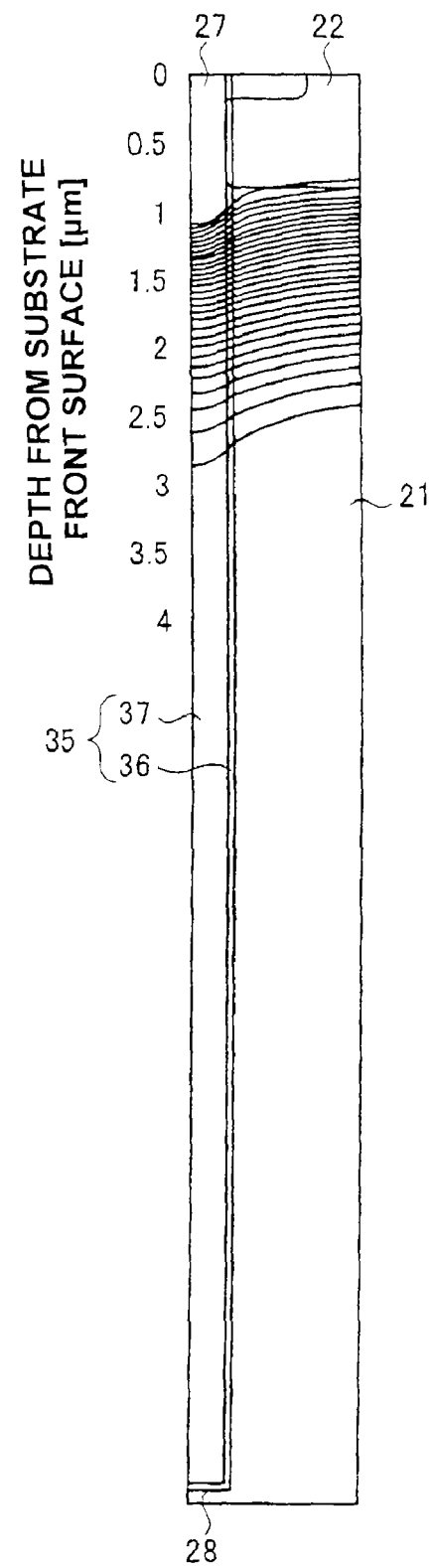
FIG. 24 is a cross-sectional view showing simulation results on the potential when the relative permittivity ∈r is set to 12 in the MISFET of FIG. 15.
Figure 25:
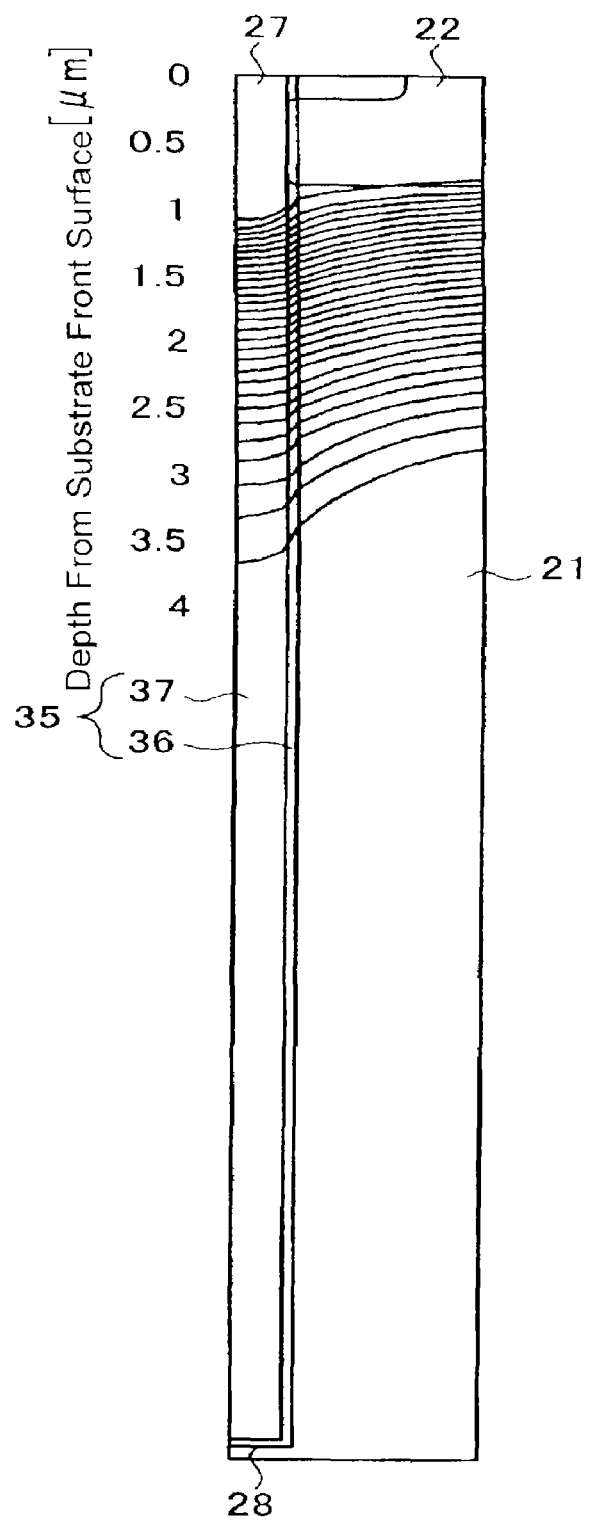
FIG. 25 is a cross-sectional view showing simulation results on the potential when the relative permittivity ∈r is set to 40 in the MISFET of FIG. 15.
Figure 26:
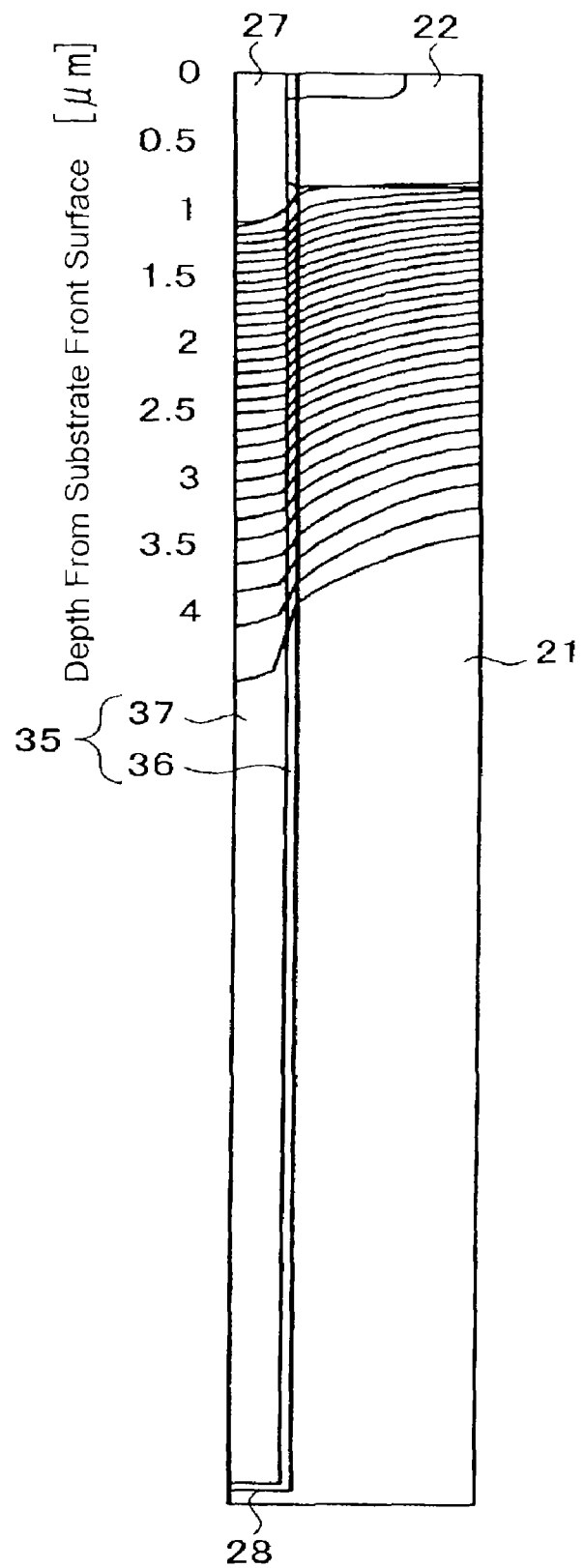
FIG. 26 is a cross-sectional view showing simulation results on the potential when the relative permittivity ∈r is set to 100 in the MISFET of FIG. 15.
Figure 27:
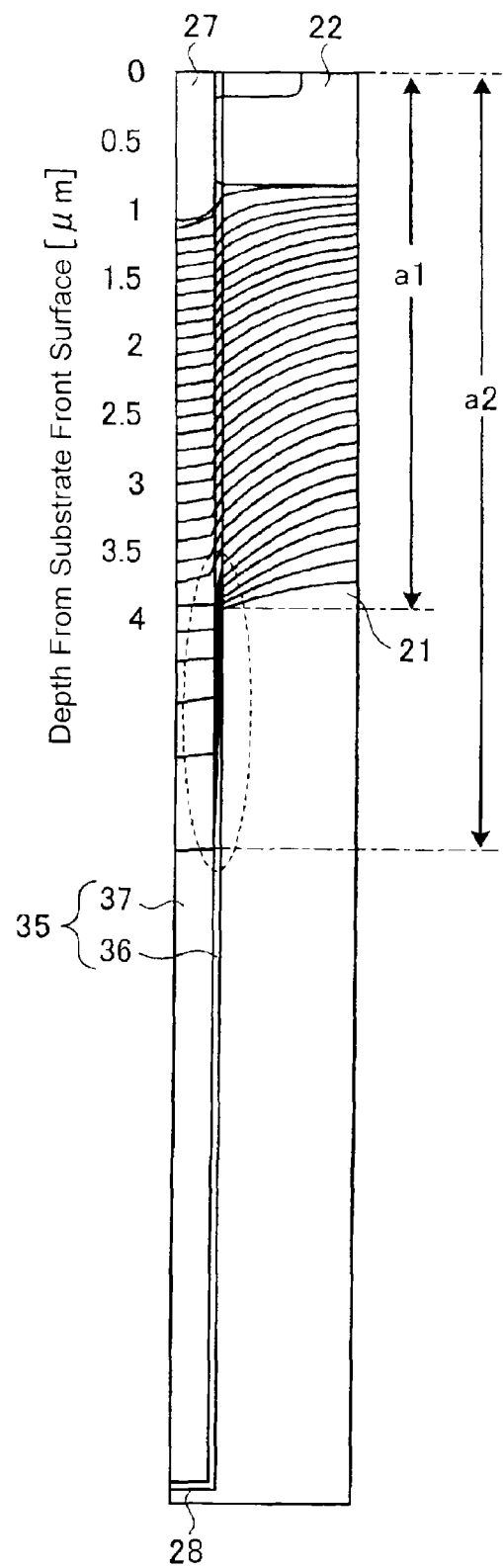
FIG. 27 is a cross-sectional view showing simulation results on the potential when the relative permittivity ∈r is set to 300 in the MISFET of FIG. 15.
Figure 35:
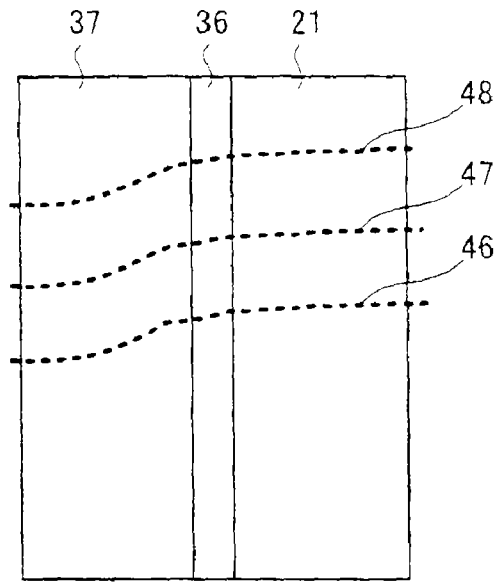
FIG. 35 is an enlarged cross-sectional view diagrammatically showing the portion encircled by the broken line in FIG. 22.
Figure 36:
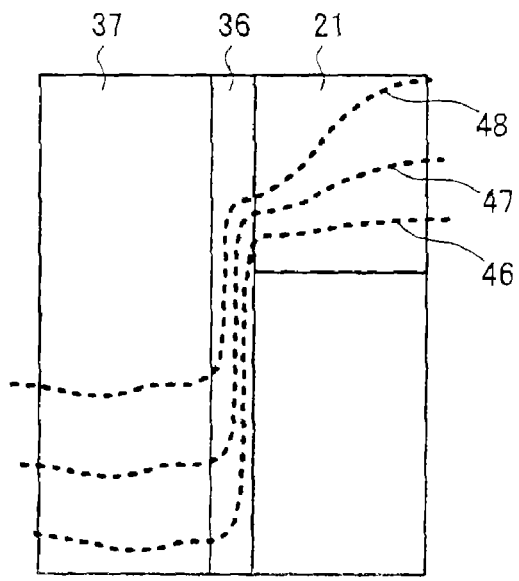
FIG. 36 is an enlarged cross-sectional view diagrammatically showing the portion encircled by the broken line in FIG. 27.

FIGS. 35 and 36 are enlarged cross-sectional views diagrammatically showing the portions encircled by the broken lines in FIGS. 22 and 27. As is apparent from a comparison between FIGS. 35 and 36, it is found that the curvature of the equipotential lines 46, 47 and 48 at the interface between n-drift region 21 and high-permittivity dielectric 36 in the outer portion when the relative permittivity ∈r of high-permittivity dielectric 37 in the inner portion is higher (FIG. 36, relative permittivity ∈r: 300) is greater than that when the relative permittivity ∈r of high-permittivity dielectric 37 in the inner portion is lower (FIG. 35, relative permittivity ∈r: 3.9). As shown in FIG. 36, when the relative permittivity ∈r of high-permittivity dielectric 37 in the inner portion is high, equipotential lines 46, 47 and 48 in high-permittivity dielectric 36 in the outer portion become parallel to the sidewall of the trench, so that the electric field is likely to be concentrated, resulting in increased electric field strength in the portion L.

Third Embodiment

Figure 37:
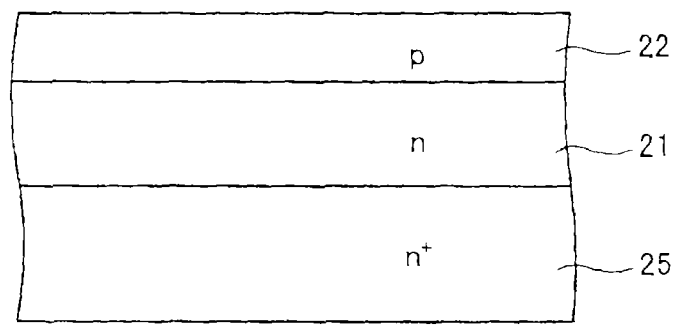
FIG. 37 is a cross-sectional view showing the method for manufacturing the trench gate type MISFET according to a third embodiment of the invention.

FIGS. 37 to 44 are cross-sectional views showing a method for manufacturing the trench gate type MISFET according to a third embodiment of the invention. Firstly, an n-semiconductor layer, which will be n-drift region 21, is epitaxially grown on n$^+$-substrate, which will be n+-drain region 25. Subsequently, a p-type impurity, such as boron ions, is implanted into the surface of the epitaxially grown layer, followed by thermal diffusion to provide a p-semiconductor layer, which will be p-base region 22 (FIG. 37).

Figure 38:
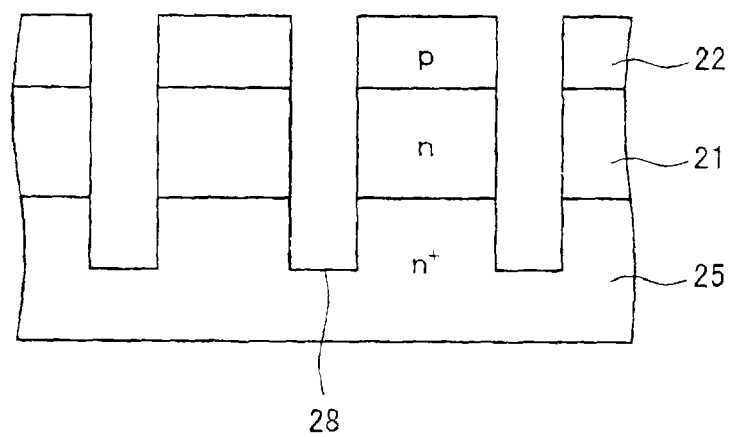
FIG. 38 is a cross-sectional view showing the method for manufacturing the trench gate type MISFET according to a third embodiment of the invention.
Figure 39:
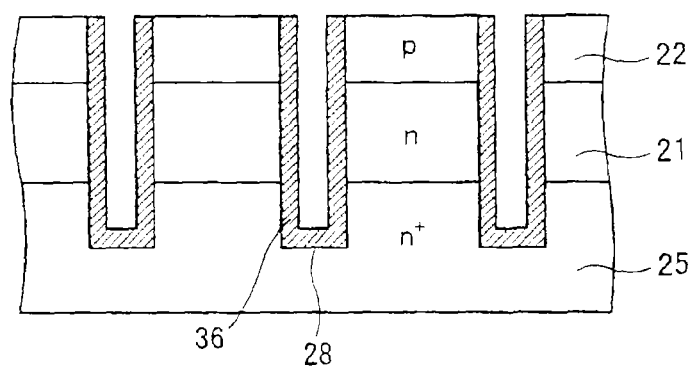
FIG. 39 is a cross-sectional view showing the method for manufacturing the trench gate type MISFET according to a third embodiment of the invention.

Thereafter, reactive ion etching is used to form trench 28 extending from the surface of the p-semiconductor layer into the n$^+$-substrate (FIG. 38). Then, thermal oxidation is used to cover the inner surface of trench 28 with a silicon oxide film ($SiO_2$) (FIG. 39). The silicon oxide film is high-permittivity dielectric 36 in the outer portion in the MISFET according to the second embodiment. By covering the inner surface of trench 28 with the silicon oxide film, the sidewall of the trench is chemically stabilized. This also reduces the gate-drain capacitance when the MISFET is completed.

Figure 40:
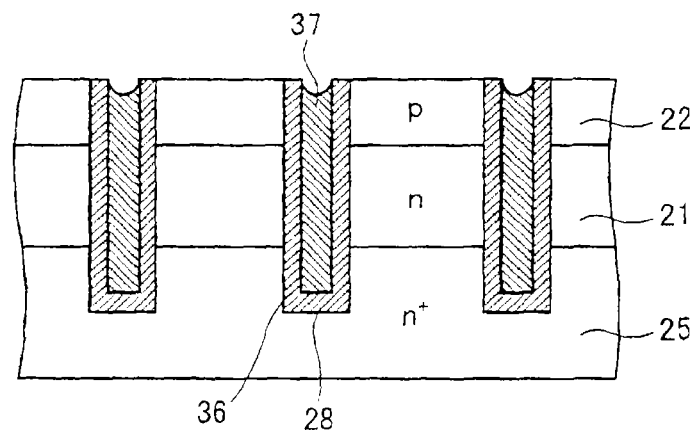
FIG. 40 is a cross-sectional view showing the method for manufacturing the trench gate type MISFET according to a third embodiment of the invention.
Figure 41:
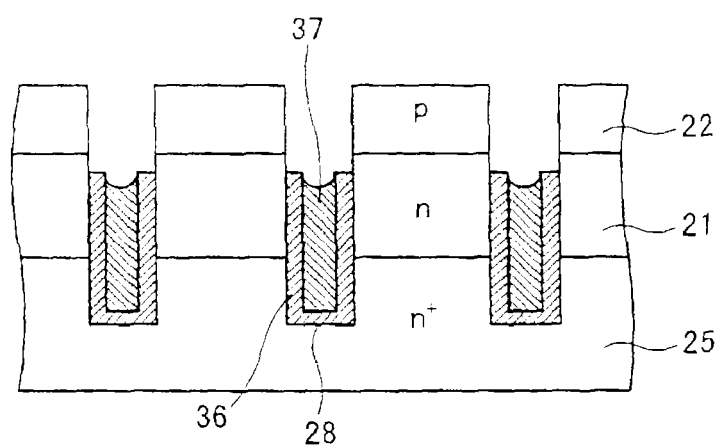
FIG. 41 is a cross-sectional view showing the method for manufacturing the trench gate type MISFET according to a third embodiment of the invention.
Figure 42:
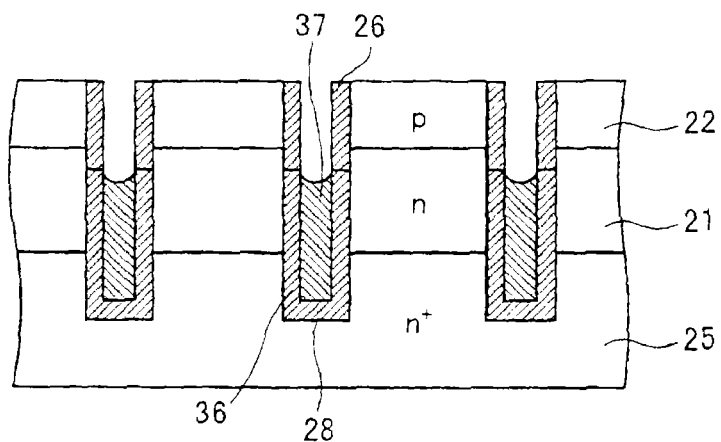
FIG. 42 is a cross-sectional view showing the method for manufacturing the trench gate type MISFET according to a third embodiment of the invention.
Figure 43:
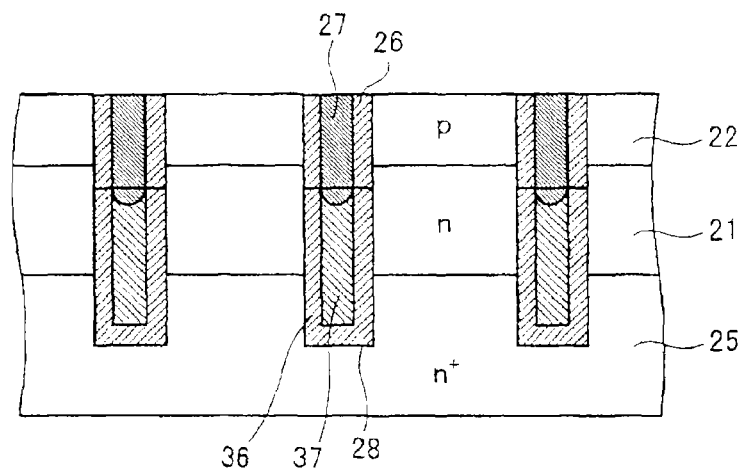
FIG. 43 is a cross-sectional view showing the method for manufacturing the trench gate type MISFET according to a third embodiment of the invention.
Figure 44:
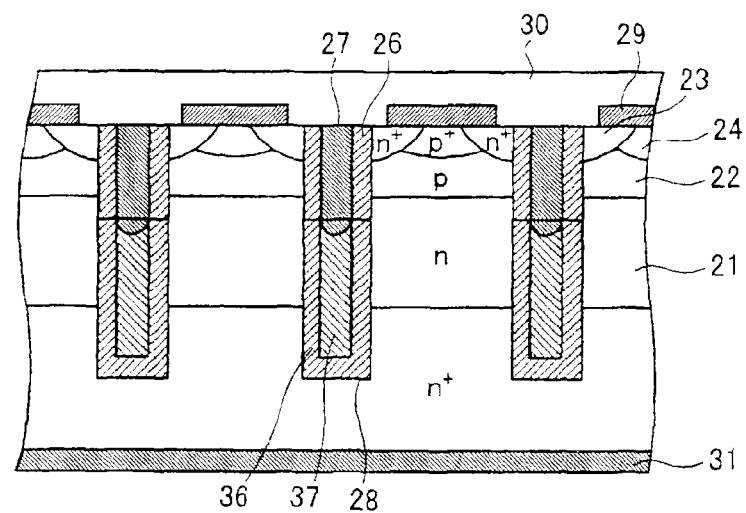
FIG. 44 is a cross-sectional view showing the method for manufacturing the trench gate type MISFET according to a third embodiment of the invention.

Thereafter, a high-permittivity dielectric material is deposited to fill the inner portion of trench 28 with high-permittivity dielectric 37 (FIG. 40). Subsequently, dry etching is used to remove the upper half of high-permittivity dielectric 36 in the outer portion and high-permittivity dielectric 37 in the inner portion (FIG. 41). Then, thermal oxidation is used to form gate insulator 26 on the sidewall surface in the upper half of trench 28 (FIG. 42). The inner portion of gate insulator 26 in trench 28 is filled again with polysilicon heavily doped with an impurity to form gate electrode 27 (FIG. 43).

Finally, n-type and p-type impurities, such as arsenic and boron ions, are implanted, followed by thermal diffusion to provide n$^+$-source region 23 and p$^+$-contact region 24. Thereafter, a process similar to that in a typical method for manufacturing a semiconductor device is used to form source electrode 29, interlayer insulator 30 and drain electrode 31 (FIG. 44), and then the MISFET according to the second embodiment shown in FIG. 14 is completed. As a special case, if the same material as high-permittivity dielectric 37 in the inner portion is used for high-permittivity dielectric 36 in the outer portion in the process shown in FIG. 39, the MISFET according to the first embodiment shown in FIG. 1 is completed.

Fourth Embodiment

Figure 45:
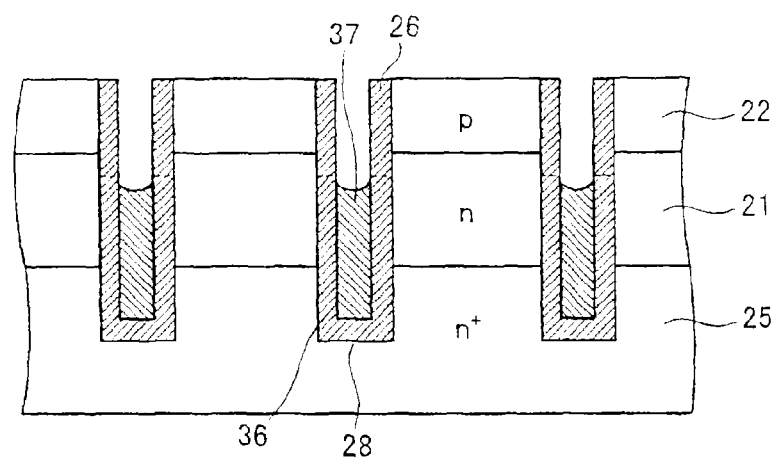
FIG. 45 is a cross-sectional view showing the method for manufacturing the trench gate type MISFET according to a fourth embodiment of the invention.
Figure 46:
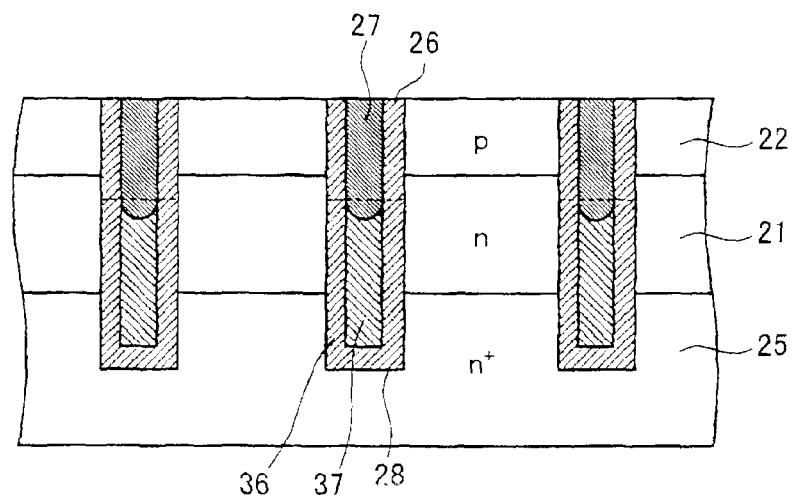
FIG. 46 is a cross-sectional view showing the method for manufacturing the trench gate type MISFET according to a fourth embodiment of the invention.
Figure 47:
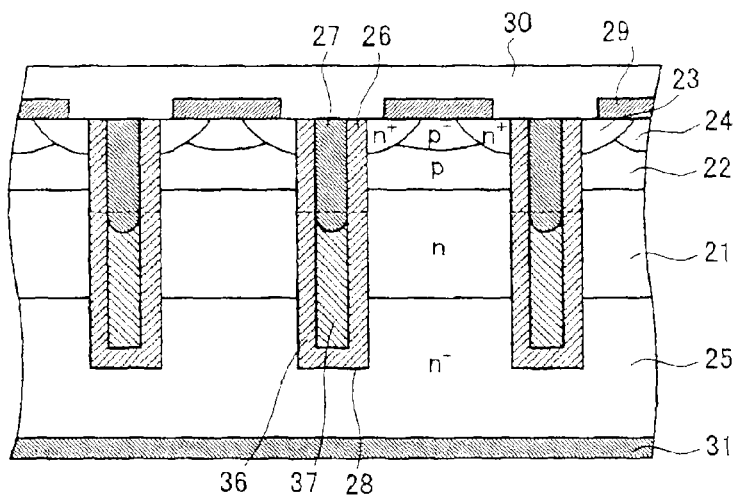
FIG. 47 is a cross-sectional view showing the method for manufacturing the trench gate type MISFET according to a fourth embodiment of the invention.
Figure 48:
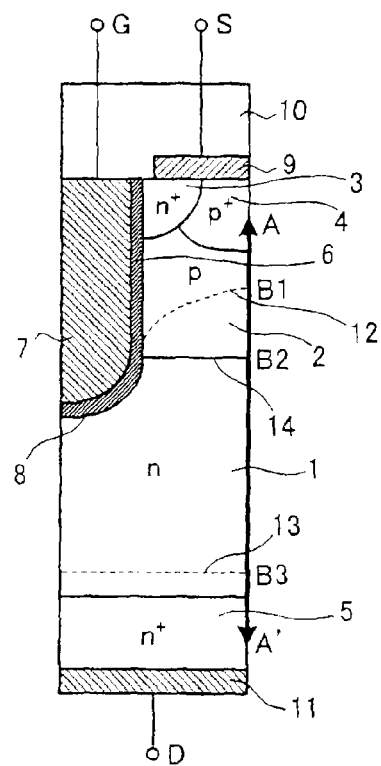
FIG. 48 is a cross-sectional view showing the configuration of a conventional trench gate type MISFET.

FIGS. 45 to 47 are cross-sectional views showing a method for manufacturing the trench gate type MISFET according to a fourth embodiment of the invention. Firstly, as in the third embodiment, the processes shown in FIGS. 37 to 39 are performed to cover the inner surface of trench 28 with a silicon oxide film ($SiO_2$) (FIG. 39). Thereafter, a high-permittivity dielectric material is deposited to fill the lower half of trench 28 with high-permittivity dielectric 37 in the inner portion. In this process, the deposition of high-permittivity dielectric 37 is terminated before it is completed to ensure not to fill up the region where the gate electrode will be formed. On the sidewall of the trench in the upper half of trench 28, that is, in the region where the gate electrode will be formed, there remains the silicon oxide film that is high-permittivity dielectric 36 in the outer portion, which in turn becomes gate insulator 26 (FIG. 45).

Thereafter, the inner portion of gate insulator 26 in trench 28 is filled with the same material as high-permittivity dielectric 37 in the inner portion to fill up the upper half of trench 28. In this process, high-permittivity dielectric 37 filled in the upper half of trench 28 is heavily doped with an impurity to impart conductivity thereto, causing it to function as gate electrode 27 (FIG. 46). In this way, high-permittivity dielectric 37 in the inner portion and gate electrode 27 can advantageously be manufactured in successive processes. This is also advantageous in that gate electrode 27 and high-permittivity dielectric 37 in the inner portion are integrated, so that the stress at the interface there between is reduced.

Finally, as in the third embodiment, n$^+$-source region 23, p$^+$-contact region 24, source electrode 29, interlayer insulator 30 and drain electrode 31 are formed (FIG. 47), and then the MISFET according to the second embodiment shown in FIG. 14 is completed. As a special case, if the same material as high-permittivity dielectric 37 in the inner portion is used for high-permittivity dielectric 36 in the outer portion in the process shown in FIG. 39, the MISFET according to the first embodiment shown in FIG. 1 is completed.

For example, when $SrTiO_3$ is used to form high-permittivity dielectric 37 in the inner portion, $SrTiO_3$ doped with niobium (Nb) can be formed as gate electrode 27.

The invention described above is not limited to the above embodiments, but various changes can be made thereto. For example, the dimensions and concentrations set forth in the embodiments are provided only by way of example, and the invention is not limited to these values. Although the first conductivity type is n-type and the second conductivity type is p-type in the embodiments, the invention can equally be carried out when the first conductivity type is p-type and the second conductivity type is n-type. The high-permittivity dielectric region under the gate electrode may be formed of a plurality of materials. In this case, a material with relatively high relative permittivity may be used along with a material with relatively low relative permittivity, such as a silicon oxide film, around or inside the higher-permittivity material. The invention is applicable not only to a MISFET but also to an IGBT. When the invention is applied to an IGBT, n$^+$-source region 23 and n+-drain region 25 in the above description may be replaced with an n$^+$-emitter region and a p$^+$-collector region, respectively. Furthermore, an n$^+$-buffer region may be formed between the drift region and the p$^+$-collector region.

INDUSTRIAL APPLICABILITY

As described above, the semiconductor device and the method for manufacturing the same according to the invention are useful for a MIS-type semiconductor device having a trench gate structure, particularly suitable to a power semiconductor device, such as a MISFET and IGBT, which requires a high withstand voltage and high current capacity.

Thus, a semiconductor device and method for manufacturing the same have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

DESCRIPTION OF REFERENCE NUMERALS AND SIGNS 21 drift region
22 base region
23 source region
24 contact region 25 drain region
26 gate insulator
27 gate electrode
28 trench
29 source electrode
30 interlayer insulator
31 drain electrode
32 edge of depletion layer
33 edge of depletion layer
34 pn junction
35, 36, 37 high-permittivity dielectric

What is claimed is:

1. A semiconductor device comprising: a drift region of a first conductivity type; a base region of a second conductivity type formed on a first principal surface of the drift region; a source region of the first conductivity type formed on a surface layer of the base region; a drain region of the first conductivity type formed on a second principal surface of the drift region; a trench, formed adjacent to the source region and extending from the first principal surface through the base region into the drift region; a high-permittivity dielectric filled in the lower half of the trench; and an insulated gate structure including a gate insulator and a gate electrode formed only in the upper half of the trench, wherein the relative permittivity of the high-permittivity dielectric is greater than that of a silicon oxide film.

2. A semiconductor device comprising:
a drift region of a first conductivity type; a base region of a second conductivity type formed on a first principal surface of the drift region; a source region of the first conductivity type formed on a surface layer of the base region; a drain region of the first conductivity type formed on a second principal surface of the drift region; a trench, formed adjacent to the source region and extending from the first principal surface through the base region into the drift region; a high-permittivity dielectric filled in the lower half of the trench; and an insulated gate structure including a gate insulator and a gate electrode formed only in the upper half of the trench, wherein the relative permittivity of the high-permittivity dielectric is greater than that of a silicon nitride film.

3. A semiconductor device comprising: a drift region of a first conductivity type; a base region of a second conductivity type formed on a first principal surface of the drift region; an emitter region of the first conductivity type formed on a surface layer of the base region; a collector region of the second conductivity type formed on a second principal surface of the drift region; a trench, formed adjacent to the emitter region, extending from the first principal surface through the base region into the drift region; a high-permittivity dielectric filled in the lower half of the trench; and an insulated gate structure including a gate insulator and a gate electrode formed only in the upper half of the trench, wherein the relative permittivity of the high-permittivity dielectric is greater than that of a silicon oxide film.

4. A semiconductor device comprising:
a drift region of a first conductivity type; a base region of a second conductivity type formed on a first principal surface of the drift region; an emitter region of the first conductivity type formed on a surface layer of the base region; a collector region of the second conductivity type formed on a second principal surface of the drift region; a trench, formed adjacent to the emitter region, extending from the first principal surface through the base region into the drift region; a high-permittivity dielectric filled in the lower half of the trench; and an insulated gate structure including a gate insulator and a gate electrode formed only in the upper half of the trench, wherein the relative permittivity of the high-permittivity dielectric is greater than that of a silicon nitride film.

5. the semiconductor device according to claim 1 or 2, wherein the high-permittivity dielectric is in contact with the drain region.

6. the semiconductor device according to claim 3 or 4, wherein the high-permittivity dielectric is in contact with the collector region.

7. The semiconductor device according to claim 1, 2, 3 or 4, wherein the deepest portion of the high-permittivity dielectric is deeper than the edge of a depletion layer extending into the drift region in the off-state.

8. the semiconductor device according to claim 1, 2, 3, or 4, wherein the high-permittivity dielectric is in contact with the gate electrode.

9. A semiconductor device according to claim 1, comprising a plurality of high-permittivity dielectrics filled in the lower half of the trench.

10. A semiconductor device according to claim 2, comprising a plurality of high-permittivity dielectrics filled in the lower half of the trench.

11. A semiconductor device according to claim 3, comprising a plurality of high-permittivity dielectrics filled in the lower half of the trench.

12. A semiconductor device according to claim 4, comprising a plurality of high-permittivity dielectrics filled in the lower half of the trench.

13. the semiconductor device according to claim 9, wherein one of the plurality of high-permittivity dielectrics is in contact with the drain region.

14. the semiconductor device according to claim 11, wherein one of the plurality of high-permittivity dielectrics is in contact with the collector region.

15. the semiconductor device according to claim 9, wherein one of the plurality of high-permittivity dielectrics is in contact with the gate electrode.

16. The semiconductor device according to claim 9, wherein the deepest portion of the high-permittivity dielectric, provided at the deepest position, of the plurality of the high-permittivity dielectrics is deeper than the edge of a depletion layer extending into the drift region in the off-state.

17. A method for manufacturing the semiconductor device comprising: providing a first semiconductor layer of a first conductivity type as a drift region; providing a second semiconductor layer of a second conductivity type on the first semiconductor layer as a base region; forming a trench from a surface of the second semiconductor layer through the second semiconductor layer into the first semiconductor layer; filling the trench with a high-permittivity dielectric; removing the high-permittivity dielectric in the upper portion of the trench; forming a gate insulator in the part of the trench where the high-permittivity dielectric has been removed; and filling the portion of the trench that is inside the gate insulator with a gate electrode.

18. the semiconductor device according to claim 10, wherein the high-permittivity dielectric is in contact with the drain region.

19. the semiconductor device according to claim 12, wherein the high-permittivity dielectric is in contact with the collector region.

20. The semiconductor device according to claim 10, wherein the deepest portion of the high-permittivity dielectric is deeper than the edge of a depletion layer extending into the drift region in the off-state.

21. The semiconductor device according to claim 11, wherein the deepest portion of the high-permittivity dielectric is deeper than the edge of a depletion layer extending into the drift region in the off-state.

22. The semiconductor device according to claim 12, wherein the deepest portion of the high-permittivity dielectric is deeper than the edge of a depletion layer extending into the drift region in the off-state.

23. the semiconductor device according to claim 10, wherein the high-permittivity dielectric is in contact with the gate electrode.

24. the semiconductor device according to claim 11, wherein the high-permittivity dielectric is in contact with the gate electrode.

25. the semiconductor device according to claim 12, wherein the high-permittivity dielectric is in contact with the gate electrode.

* * * * *